US011894610B2

United States Patent
Turpin et al.

(10) Patent No.: US 11,894,610 B2
(45) Date of Patent: Feb. 6, 2024

(54) SYSTEM AND METHOD FOR PROVIDING A COMPACT, FLAT, MICROWAVE LENS WITH WIDE ANGULAR FIELD OF REGARD AND WIDEBAND OPERATION

(71) Applicant: All.Space Networks Limited, Reading (GB)

(72) Inventors: Jeremiah P. Turpin, Boalsburg, PA (US); Clinton P. Scarborough, State College, PA (US); Daniel F. DiFonzo, Rockville, MD (US); John Finney, London (GB)

(73) Assignee: All.Space Networks Limited, Reading (GB)

( * ) Notice: Subject to any disclaimer, the term of this patent is extended or adjusted under 35 U.S.C. 154(b) by 439 days.

(21) Appl. No.: 15/849,049

(22) Filed: Dec. 20, 2017

(65) Prior Publication Data

US 2018/0183152 A1   Jun. 28, 2018

Related U.S. Application Data

(60) Provisional application No. 62/438,181, filed on Dec. 22, 2016.

(51) Int. Cl.
*H01Q 15/02* (2006.01)
*G06F 30/20* (2020.01)
(Continued)

(52) U.S. Cl.
CPC ............ *H01Q 15/02* (2013.01); *G06F 30/20* (2020.01); *H01Q 1/288* (2013.01); *H01Q 1/48* (2013.01);
(Continued)

(58) Field of Classification Search
CPC ...... H01Q 25/008; H01Q 15/02; G06F 30/20; G06F 30/23; G06F 2111/10
See application file for complete search history.

(56) References Cited

U.S. PATENT DOCUMENTS 3,787,872 A   1/1974   Kauffman
4,558,324 A   12/1985  Clapp
(Continued)

FOREIGN PATENT DOCUMENTS

| CN | 101894390 A | * | 11/2010 | |
| FR | 2576112 A1 | * | 1/1986 | ............. G02B 13/24 |
| WO | WO-2016/012745 A1 | | 1/2016 | |

OTHER PUBLICATIONS

Qi, Mei Qing, et al. "Tailoring radiation patterns in broadband with controllable aperture field using metamaterials." IEEE transactions on antennas and propagation 61.11 (2013): 5792-5798. (Year: 2013).*

(Continued)

*Primary Examiner* — David A Hopkins
(74) *Attorney, Agent, or Firm* — Wolf, Greenfield & Sacks, P.C.

(57) ABSTRACT

A system designs a thin and relatively flat microwave focusing lens that can produce multiple simultaneous beams, using readily-available isotropic dielectric materials, and having a gradient-index (GRIN) profile. The design optimizes the lens to achieve beam scanning and/or multiple beams over a wide field of regard (FOR) with broad bandwidth and a very short focal length compared with conventional lenses. The lens can be used individually or as an element in a more complex antenna having multiple lenses in various orientations that are independently switched, selected and/or excited simultaneously as elements in a phased array. The antenna terminal incorporates such lens into an array of lenses along with one or more feeds to (Continued)

produce single or multiple beams covering a broad field of regard for such applications as satellite communications on-the-move, cellular, broadband point-point or point-multipoint and other terrestrial or satellite communications systems. The lens and array design support multiple simultaneous independently steerable beams as well as null placement for interference cancellation.

20 Claims, 9 Drawing Sheets

(51) Int. Cl.
| | |
|---|---|
| H01Q 25/00 | (2006.01) |
| H01Q 15/08 | (2006.01) |
| H01Q 1/28 | (2006.01) |
| H01Q 1/48 | (2006.01) |
| H01Q 19/06 | (2006.01) |

(52) U.S. Cl.
CPC .......... *H01Q 15/08* (2013.01); *H01Q 19/062* (2013.01); *H01Q 25/008* (2013.01)

(56) References Cited

U.S. PATENT DOCUMENTS

| | | | | |
|---|---|---|---|---|
| 4,582,655 | A * | 4/1986 | Greener ........... | B29D 11/00682 |
| | | | | 65/83 |
| 4,905,014 | A | 2/1990 | Gonzalez et al. | |
| 5,067,067 | A | 11/1991 | Estelle et al. | |
| 5,999,303 | A * | 12/1999 | Drake ................... | H02N 1/008 |
| 6,169,525 | B1 | 1/2001 | Dziadek et al. | |
| 7,190,324 | B2 | 3/2007 | Henderson | |
| 7,355,560 | B2 | 4/2008 | Nagai | |
| 8,493,273 | B2 | 7/2013 | Lier | |
| 8,848,295 | B2 | 9/2014 | Smith et al. | |
| 9,640,867 | B2 * | 5/2017 | Behdad ............... | H01Q 21/061 |
| 10,256,537 | B2 | 4/2019 | Besoli et al. | |
| 2004/0108961 | A1 * | 6/2004 | Hay ..................... | H01Q 15/147 |
| | | | | 343/781 CA |
| 2008/0055175 | A1 * | 3/2008 | Rebeiz ................ | H01Q 13/085 |
| | | | | 343/754 |
| 2010/0207833 | A1 * | 8/2010 | Toso ................... | H01Q 25/008 |
| | | | | 343/753 |
| 2012/0274525 | A1 * | 11/2012 | Lam ..................... | H01Q 19/06 |
| | | | | 343/754 |
| 2013/0039620 | A1 * | 2/2013 | Ho ......................... | G02B 3/02 |
| | | | | 385/33 |
| 2014/0076398 | A1 * | 3/2014 | Gordon ............... | G02B 3/0087 |
| | | | | 703/2 |
| 2016/0087344 | A1 | 3/2016 | Artemenko et al. | |

OTHER PUBLICATIONS

Mateo-Segura, Carolina, et al. "Flat Luneburg lens via transformation optics for directive antenna applications." IEEE Transactions on Antennas and Propagation 62.4 (2014): 1945-1953. (Year: 2014).*
Hailu, Daniel M., et al. "Hybrid spectral-domain ray tracing method for fast analysis of millimeter-wave and terahertz-integrated antennas." IEEE Transactions on Terahertz Science and Technology 1.2 (2011): 425-434. (Year: 2011).*
Hailu, Daniel M., Iraj A. Ehtezazi, and Safieddin Safavi-Naeini. "Fast analysis of terahertz integrated lens antennas employing the spectral domain ray tracing method." IEEE Antennas and Wireless Propagation Letters 8 (2008): 37-39. (Year: 2008).*
Peebles, Ann Lee. "A dielectric bifocal lens for multibeam antenna applications." IEEE Transactions on Antennas and Propagation 36.5 (1988): 599-606. (Year: 1988).*
Allen, Jeffery Wayne. "Application of Metamaterials to the Optimization of Smart Antenna Systems." PhDT (2011). (Year: 2011).*
Wheeland, Sara Ruth. Metamaterial composites with tunable electromagnetic properties. Diss. UC San Diego, 2013. (Year: 2013).*
Karki, Sabin. "Beam-steerable E-band lens antenna for 5G backhaul link." (2016). (Year: 2016).*
Huang, Ming, et al. "Design and optimization of spherical lens antennas including practical feed models." Progress in Electromagnetics Research 120 (2011): 355-370. (Year: 2011).*
Meng, Fan-Yi, et al. "Automatic design of broadband gradient index metamaterial lens for gain enhancement of circularly polarized antennas." Progress in Electromagnetics Research 141 (2013): 17-32. (Year: 2013).*
Wikipedia, "Radio Spectrum", accessed electronically on Aug. 7, 2020 (Year: 2020).*
Campbell, Sawyer D., et al. "Advanced gradient-index lens design tools to maximize system performance and reduce SWaP." Advanced Optics for Defense Applications: UV through LWIR. vol. 9822. International Society for Optics and Photonics, 2016. (Year: 2016).*
Weiß, Matthias. "Digital Antenna." NATO SET-136 Lecture Series Multistatic Surveillance and Reconnaissance: Sensor, Signals and Data Fusion (2009). (Year: 2009).*
Brocker, Donovan Edward. "Efficient optimization of antenna and electromagnetic devices at medium, radio, and optical frequencies." (2016). (Year: 2016).*
Campbell, Sawyer D., et al. "Advancements in multi-objective and surrogate-assisted GRIN lens design and optimization." Novel Optical Systems Design and Optimization XIX. vol. 9948. International Society for Optics and Photonics, 2016. (Year: 2016).*
Easum, John A., et al. "Analytical surrogate model for the aberrations of an arbitrary GRIN lens." Optics express 24.16 (2016): 17805-17818. (Year: 2016).*
Turpin, Jeremiah P., Donovan Brocker, and Douglas H. Werner. "Optimization of quasi-conformal transformation optics lenses with an arbitrary GRIN-capable ray tracer." 2013 IEEE Antennas and Propagation Society International Symposium (Apsursi). IEEE, 2013. (Year: 2013).*
Bucci, Ovidio Mario, et al. "Synthesis of new variable dielectric profile antennas via inverse scattering techniques: a feasibility study." IEEE transactions on antennas and propagation 53.4 (2005): 1287-1297. (Year: 2005).*
Fenn, Alan J., et al. "The development of phased-array radar technology." Lincoln Laboratory Journal 12.2 (2000): 321-340. (Year: 2000).*
Brem, Robert, and Thomas F. Eibert. "Ray tracing with multi-radiation transmitters." Advances in Radio Science 10.B. 3 (2012): 75-78. (Year: 2012).*
Karttunen, Aki. "Millimetre and submillimetre wave antenna design using ray tracing", PhD Dissertation, Aug. 2013, Aalto University, (Year: 2013).*
Dr. Natalia Nikolova, "Lecture 19: Reflector Antennas", McMaster University, 2016, link: www(dot)ece(dot)mcmaster(dot)ca/faculty/nikolova/antenna_dload/current_lectures/L19_Reflector(dot)pdf (Year: 2016).*
Antenna-Theory.com, "The Parabolic Reflector Antenna (Satellite Dish)—3", accessed via the WayBack machine with the archive date of Nov. 2, 2015 (Year: 2015).*
University of Hawaii, Antarctic Impulsive Transient Antenna, "Antenna Introduction/Basics" notes, accessed on Nov. 17, 2021 link: https://www(dot)phys(dot)hawaii(dot)edu/~anita/new/papers/militaryHandbook/antennas(dot)pdf (Year: 2021).*
IEEE Antennas and Propagation Society, "IEEE Standard for Definitions of Terms for Antennas", 2013, IEEE Standard 145-2013 (Year: 2013).*
Godi, Gaël, et al. "Design and optimization of three-dimensional integrated lens antennas with genetic algorithm." IEEE transactions on antennas and propagation 55.3 (2007): 770-775. (Year: 2007).*
Ruphuy, "Electrically Thin Lenses and Reflectors", Aug. 2016, PhD Dissertation, University of Waterloo, URL: uwspace(dot)uwaterloo(dot)ca/handle/10012/10633?show=full (Year: 2016).*
Nguyen et al., "Design, Analysis, and Characterization of Metamaterial Quasi-Optical Components for Millimeter-Wave Automotive Radar", 2013, PhD Dissertation, Duke University (Year: 2013).*

(56) References Cited

OTHER PUBLICATIONS

"Feko User's Manual Suite 7.0", Altair University, http://altairuniversity.com/wp-content/uploads/2015/03/UserManual.pdf, Nov. 26, 2016, pp. 1-13.
"Latest Antennas Released Since Version 2016.1", Antennas Magus, Oct. 27, 2017, https://web.archive.org/web/20161027061355/http://www.antennamagus.com/antennas.php?page=antennas, 51 pgs.
"User Manual for Feko 14.0", Altair University, Dec. 31, 2015, https://altairuniversity.com/wp-content/uploads/2016/03/UserManual.pdf, pp. 3-10.
International Search Report and Written Opinion for PCT/IB2017/058318, dated Jul. 27, 2018, 16 pages.
Pendry, John B., David Schurig, and David R. Smith, "Controlling electromagnetic fields" *Science* 312, No. 5781 (2006): 1780-1782.
Kwon, Do-Hoon, and Douglas H. Werner, "Transformation optical designs for wave collimators, flat lenses and right-angle bends," *New Journal of Physics* 10, No. 11 (2008): 115023.
Demetriadou, Angela, and Yang Hao, "Slim Luneburg lens for antenna applications," *Optics express* 19, No. 21 (2011): 19925-19934.
Mateo-Segura, Carolina, Amy Dyke, Hazel Dyke, Sajad Haq, and Yang Hao, "Flat Luneburg lens via transformation optics for directive antenna applications," *IEEE Transactions on Antennas and Propagation* 62, No. 4 (2014): 1945-1953.
Merchand, Erich. *Gradient index optics*, Elsevier, 2012, pp. 1-165.
C. A. Balanis, "Antenna Measurements", Antenna theory, Analysis and Design, 3rd ed. Wiley New York (2005): 1001-1047.
C. A. Balanis, "Antenna Measurements", Antenna theory, Analysis and Design, 3rd ed. Wiley New York (2005): 27-132.
CMAES (Covariance Matrix Adaptation Evolutionary Strategy) Gregory, Micah D., Zikri Bayraktar, and Douglas H. Werner, "Fast optimization of electromagnetic design problems using the covariance matrix adaptation evolutionary strategy," IEEE Transactions on Antennas and Propagation 59, No. 4 (2011): 1275-1285.
(GA) Genetic Algorithm, Weile, Daniel S., and Eric Michielssen; "Genetic algorithm optimization applied to electromagnetics: A review." IEEE Transactions on Antennas and Propagation 45, No. 3 (1997): 343-353.
Hadka, David, and Patrick Reed, "Borg: An auto-adaptive many-objective evolutionary computing framework," Evolutionary computation 21, No. 2 (2013): 231-259.
PSO (Particle Swarm Optimizer), Rahmat-Samii, Yahya; "Genetic algorithm (GA) and particle swarm optimization (PSO) in engineering electromagnetics" Applied Electromagnetics and Communications, 2003, ICECom 2003, 17th International Conference on, pp. 1-5. IEEE, 2003.
Moore, Jacqueline, Richard Chapman, and Gerry Dozier. "Multiobjective particle swarm optimization" in Proceedings of the 38th annual on Southeast regional conference, pp. 56-57. ACM, 2000.
Morgan, Kenneth L., Donovan E. Brocker, Sawyer D. Campbell, Douglas H. Werner, and Pingjuan L. Werner. "Transformation-optics-inspired anti-reflective coating design for gradient index lenses." Optics letters 40, No. 11 (2015): 2521-2524.
D. M. Hailu, et al., "Hybrid Spectral-Domain Ray Tracing Method for Fast Analysis of Millimeter-Wave and Terahertz-Integrated Antennas", IEEE Transactions on Terahertz Science and Technology, 2011, pp. 1-10.
R. Sauleau, et al., "Review of Lens Antenna Design and Technologies for Mm-Wave Shaped-Beam Applications", ResearchGate, https://www.researchgate.net/publication/280817787, Jan. 2005, 6 pgs.
M. Huang, et al., "Design and Optimization of Spherical Lens Antennas Including Practical Feed Models", Progress in Electromagnetics Research, vol. 120, pp. 355-370, 2011.

\* cited by examiner

Optimization Data Flow Diagram

SYSTEM AND METHOD FOR PROVIDING A COMPACT, FLAT, MICROWAVE LENS WITH WIDE ANGULAR FIELD OF REGARD AND WIDEBAND OPERATION

RELATED APPLICATIONS

This application claims the benefit of U.S. Provisional Application No. 62/438,181, filed Dec. 22, 2016, the entire contents of which are incorporated herein by reference.

BACKGROUND OF THE INVENTION

Field of the Invention

The present invention relates to a system and design method that provides low-profile, thin dielectric lens antennas that have wide-angle beam steering with one or more feed elements, and that can be used with associated electronics for beam pointing control, and hardware and software interfaces with receive and transmit subsystems, allowing simultaneous one-way or two-way communications with one or more satellites or other remote communication nodes.

Background of the Related Art

Many types of antenna and terminal systems exist today for fixed installations and satellite communications (SATCOM) on-the-move (SOTM) applications. Examples include DIRECTV 3LNB Ka Ku Slim Line Dish Antenna (solidsignal.com), DISH Network Triple LNB HD Western Arc Dish Antenna (solidsignal.com), Winegard (winegard.com), KVH TracVision (kvh.com), ThinKom (thinkom.com), Gilat/RaySat (gilat.com), and Tecom/Qest (tecom-ind.com).

Fixed installations typically comprise a reflector with one or more feed antennas in the focal region of the reflector. These reflectors may be fixed and carefully pointed one time upon installation for some geostationary applications such as DTH (Direct-To-Home), DBS (Direct Broadcast Satellite), or satellite two-way Internet. Other terminals may have motorized mechanically steered reflectors or flat array panels for SOTM applications or for when an antenna at a fixed geographical location must either be able to be repointed to another satellite, track a non-geosynchronous satellite, or, in the case of SOTM, must be able to track the satellite from a moving platform. A fixed antenna such as a torus with multiple feeds may be able to select or simultaneously communicate with multiple satellites in geostationary (GEO) or non-geostationary orbit (NGSO). Another application of steerable antennas includes tracking non-geostationary satellites from a fixed geographical location such as the SES/O3b satellites or High Throughput Satellites (HTS) in non-geostationary orbits such as low earth orbit (LEO) or medium earth orbit (MEO).

Antennas for SOTM applications may feature low height profiles and steer their beams using mechanical or electronic means. Examples include mechanically steered flat panel arrays, (e.g., Gilat/RaySat, or electronically steered phased arrays, (e.g., Phasor, phasorsolutions.com, and the mechanically steered variable inclination continuous transverse stub (VICTS) technology (e.g., ThinKom Falcon 3030, thinkom.com). These systems each typically produce a single steerable beam from the antenna aperture, and in some cases, require separate apertures for transmit and receive operations.

Electronically steered phased arrays are generally expensive, even for modest aperture sizes and may incorporate hundreds to thousands of elements, each of which requires a phase control device and, with few exceptions, an amplifier. Furthermore, phased arrays are typically limited to a single beam, or must replicate the beam forming circuitry for any additional independently steered beam(s). A related electronically-steered antenna technology is holographic beamforming; the Kymeta mTENNA (kymetacorp.com) can form an electronically steerable beam using voltage-controlled devices such as liquid crystal dielectrics (LCDs) to produce the required phase and amplitude control for beam steering. However, these structures are often dispersive and narrowband, which limits the available instantaneous bandwidth.

An alternative to phased arrays and reflectors for satellite terminals is a lens antenna, such as the Luneburg lens. Lenses at microwave frequencies generate a high antenna directivity by bending the microwave electromagnetic fields with a combination of carefully designed geometry and (potentially) inhomogeneous dielectric constant profile within the lens. They can generate multiple simultaneous beams by using multiple feeds, like a reflector, but they do not suffer from aperture blockage by the feed(s). A single beam can be steered from boresight by moving a feed to a different location relative to the focal point of the lens, or by switching signals between one or more of a cluster of fixed feeds. The design principles of the current state of the art of microwave lenses are well-understood, but such lens antennas are heavy and bulky.

The concept of a flattened GRadient-INdex (GRIN) lens may be appreciated in view of recent theoretical breakthroughs in Transformation Optics (TO). Pendry, John B., David Schurig, and David R. Smith, "Controlling electromagnetic fields" *Science* 312, no. 5781 (2006): 1780-1782. However, while interesting developments in TO have been published (Kwon, Do-Hoon, and Douglas H. Werner, "Transformation optical designs for wave collimators, flat lenses and right-angle bends," *New Journal of Physics* 10, no. 11 (2008): 115023), their limitations remain severe. A direct application of the TO design process requires the use of strongly anisotropic and magnetic materials generally not found in nature which, in practice, requires metamaterials or other lossy and bandwidth-limiting structures. Approximation procedures to the direct application of TO have been published (Demetriadou, Angela, and Yang Hao, "Slim Luneburg lens for antenna applications," *Optics express* 19, no. 21 (2011): 19925-19934; Mateo-Segura, Carolina, Amy Dyke, Hazel Dyke, Sajad Haq, and Yang Hao, "Flat Luneburg lens via transformation optics for directive antenna applications," *IEEE Transactions on Antennas and Propagation* 62, no. 4 (2014): 1945-1953.), but the approximations necessary to obtain an all-dielectric lens using only isotropic materials from a TO specification result in unacceptable degradation to the device's performance.

Transformation Optics (TO) and GRadient-INdex (GRIN) optical design approaches have recently received much attention in the field of electromagnetics and optics. GRIN optics (Merchand, Erich. *Gradient index optics*, Elsevier, 2012) change the path of light or, for example, electromagnetic energy at microwave frequencies (usually depicted as rays) within a lens or other optical device to curve in desired directions, thereby affording more degrees of freedom for optical designers compared to conventional lenses that only allow refraction at input and output interfaces. By increasing the degrees of freedom, the use of GRIN lenses in a compound lightwave optical system can allow the number of lenses to be reduced while improving optical performance.

Ray tracering approaches have been used for microwave reflector design. Those ray tracers are structured specially to meet the design constraints for reflectors, which are very different from those of a transmissive lens. For instance, a reflector has only a single surface, and the impinging rays are used to directly compute far-fields based on induced current approaches, where the lens must refract curved rays through a volume, and cannot use current to compute far fields and patterns. Ray tracers have not been used for gradient index or GRIN lens designs at microwave frequencies to perform optimized designs.

Currently, full-wave analyzers with complicated algorithms are used to design lens antennas, as offered by Ticra (ticra.com). The full wave analyzers are thought necessary to account for the complexity of variables involved in designing a GRIN lens antenna. While a full wave analyzer provides a highly accurate model of the GRIN lens, it is extremely slow such that each iteration can take hours or days to calculate and it could take months or years to evaluate a sufficient number of trial configurations and large, expensive computer resources of processing modules and memory as part of an optimization process to arrive at a final design. The full-wave solver naturally produces the near-field.

Consequently, an efficient design procedure or method for choosing the refractive index profile to achieve low profile, wideband operation, and beam steering and/or multiple beams over wide angular field of regard is not currently taught. It is the purpose of the subject invention to provide such a system and method.

SUMMARY OF THE INVENTION

There is a need for a new type of antenna system that overcomes the limitations of mechanically steered antennas and electronically steered phased arrays, has high instantaneous bandwidth not limited by metamaterials or other highly dispersive structures, and is cost effective. Such an antenna system would have some or all of the following features: (a) low height profile, ideally appearing with lower volumetric depth and not requiring the protruding feeds of conventional reflectors; (b) electronically steerable beams with no moving parts; (c) capable of economically forming simultaneous multiple, independently steerable beams; (d) generally wide field of regard with beam steering over a large angular range from the aperture normal axis in any direction (depending on the application, an angular field of regard between 45 and 70 degrees is commonly required); and (e) cost structure that is substantially lower than conventional phased arrays with the typical half-wavelength element spacing, especially when considering multiple beams.

The present invention achieves these goals with the new type of antenna design method and system. A design method and example designs are provided for compact, low-profile, all-dielectric gradient-index (GRIN) lenses for microwave antenna applications. The present document describes the invention for certain geometry and associated material properties for use primarily, but not exclusively, with microwave or radio-frequency (RF) electromagnetic waves. This lens design and method produce lenses that provide better focusing capability with higher aperture efficiency at closer focal points across a wider range of incident field angles or, equivalently, for a wider range of beam steering angles, with less mass and volume than existing homogeneous or gradient-index lenses. The design system and method are a novel synthesis of analysis and techniques from optical and radio-frequency studies. The improved performance of the lens is determined by the isotropic but inhomogeneous constituent material properties of the lens, and the geometrical arrangement of the refractive index regions within the lens.

A distinction is made between known lens designs, such as the Luneburg lens, that are defined analytically, and low-profile GRIN lenses (e.g., FIG. 1(b)), for which no analytical design or performance specification exists. Existing lenses, such as the Luneburg, produce systems that are thick, heavy, and bulky. The Luneburg lens, although it does have good focusing properties, requires a system to be as deep as it is wide, and requires the exciting feeds to be placed over a spherical surface. Transformation Optics techniques have been used to reduce the system thickness of a Luneburg-derived lens, but with limited success. Obtaining similar performance from a low-profile lens (defined here as a thickness+focal length that is much less than the diameter of the lens) is nontrivial, and required the development of the invention disclosed in this document.

The lens owes its unique and desirable properties to the design methodology of the present invention, which includes: (a) a ray tracer algorithm and program or similar highly efficient and rapid simulation program using high-frequency asymptotic approximations for initial rapid modeling of transmitted or received electromagnetic fields through inhomogeneous materials as evolved from optical or very high frequency ray optics and applied to the design of a lens at microwave frequencies; (b) a known input near field or far field radiation pattern from a postulated feed antenna is used to excite the microwave lens using the ray tracer; (c) the output data from the ray tracer or simulation is used to compute the radiation pattern and directivity using principles of Physical Optics; (d) an optimization algorithm (local, stochastic global, Monte Carlo, or manual) is applied to choose the geometric properties and isotropic, inhomogeneous dielectric constant profile of the microwave lens; (e) multiple feeds at different physical locations are used by the optimizer to maximize performance over a specified angular field of regard; and (f) final verification of the design using full or detailed 3D simulation models such as HFSS (Ansys).

Optimizing the gradient-index lens with the ray tracing or approximate simulation analysis is vastly more effective than postulating a guess of the potential gradient index profile a priori and repeatedly analyzing trial configuration using detailed full wave solver simulation tools such as HFSS. The number of variables and simulations required to obtain a viable design combined with the large computer resources and slow speed of full-wave simulations would take orders of magnitude more time and incur high labor and computer costs with little or no advance knowledge of the viability of a particular a priori guesswork design configuration. On the other hand, the massively increased speed of the ray tracing and approximate simulation tool allows better results to be found rapidly. Further, ray tracing and rapid approximate simulation has not been heretofore used for the design of these GRIN lenses with similar requirements on bandwidth, field of regard, and applications. A specific innovation of the present invention is the incorporation into the overall algorithm and design procedure of a ray tracing/approximate simulation engine to rapidly perform the analysis for inhomogeneous (GRIN) microwave lenses that would ordinarily use a computationally expensive and time-consuming full-wave solver. The computer and process is used to accelerate the prediction of the physical response of the lens design candidates leading to an efficient convergence to the optimized design(s).

One key innovation of the present invention is the use of the fast and approximate ray-tracing engine in the computer-aided gradient-index lens antenna design loop. The ray tracer is used in the RF regime to provide rapid initial design results thereby substantially reducing design time. This has not previously been performed due to the lack of relevant ray tracing implementations available for use with inhomogeneous refractive devices at microwave frequencies. The ray tracer generates a near-field distribution for the candidate lens design constraints. The present invention incorporates a ray tracer and combines it with rapid evaluation of the far field radiation based on computed ray distributions into a prediction of the objective goodness, according to input criteria, of the candidate design.

The ray tracer can use substantially the same user inputs and design constraints 105 as the full-wave solver, but the internal representations (such as the geometry and ray distributions 110 and 116 for the ray tracer) will differ depending on the particular solver algorithm selected. The full-wave analysis can further be used in the present invention to confirm the accuracy of a final result, though is too slow to permit feasible optimizations for microwave GRIN lenses. Given the same design constraints, hardware, and computer resources, the current invention can achieve the same results and outcomes in seconds per iteration rather than many hours per iteration required by the full-wave solver, allowing improved results to be found. The ray tracer allows the evaluation of far-field performance on the order of 10-1,000 times faster than full-wave solutions, which allows the designer and the optimizer much more flexibility with available computational resources.

Ray tracing has been used for microwave reflector design (e.g., FIG. 1(a)), but design of a lens by ray tracing is inherently and substantially more complex than ray tracing for a reflector, and requires a significantly different solver. Efficient and accurate algorithms for complex gradient-index structures are not generally available, and have not hitherto been used for the purpose of RF lens optimizations. Unlike a reflector (FIG. 1(a)), which is completely specified by the geometric shape of the surface, the lens design process requires the specification of multiple surfaces (FIG. 1(b)), as well as the complex pattern of refractive index inside the lens. The complexity of these inputs indicates that a ray tracer suitable for design of a reflector is not generally suitable for design of a lens, and no existing software or hardware tools with lens design capability are known, which is why the slow and computationally inefficient full-wave solution has been the only viable solution, as offered by Ticra (ticra.com). The far-field output of a ray tracer for analysis of reflectors computes the far fields due to surface currents across the reflector due to the impinging rays, but does not directly compute fields directly from the ray distribution.

These and other objects of the invention, as well as many of the intended advantages thereof, will become more readily apparent when reference is made to the following description, taken in conjunction with the accompanying drawings.

DETAILED DESCRIPTION OF THE PREFERRED EMBODIMENTS

Figure 1A:
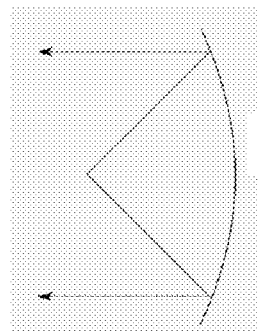
FIG. 1(a) shows a conventional reflector having a single surface, reflection-based single degree of design freedom.
Figure 1B:
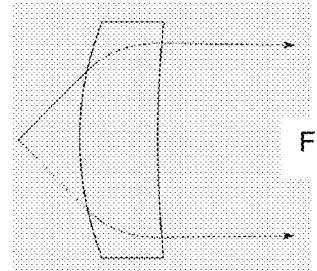
FIG. 1(b) shows a conventional GRIN lens having two surfaces and internal material gradient, refraction-based, with many degrees of design freedom.

In describing the illustrative, non-limiting preferred embodiments of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several preferred embodiments of the invention are described for illustrative purposes, it being understood that the invention may be embodied in other forms not specifically shown in the drawings.

Figure 5:
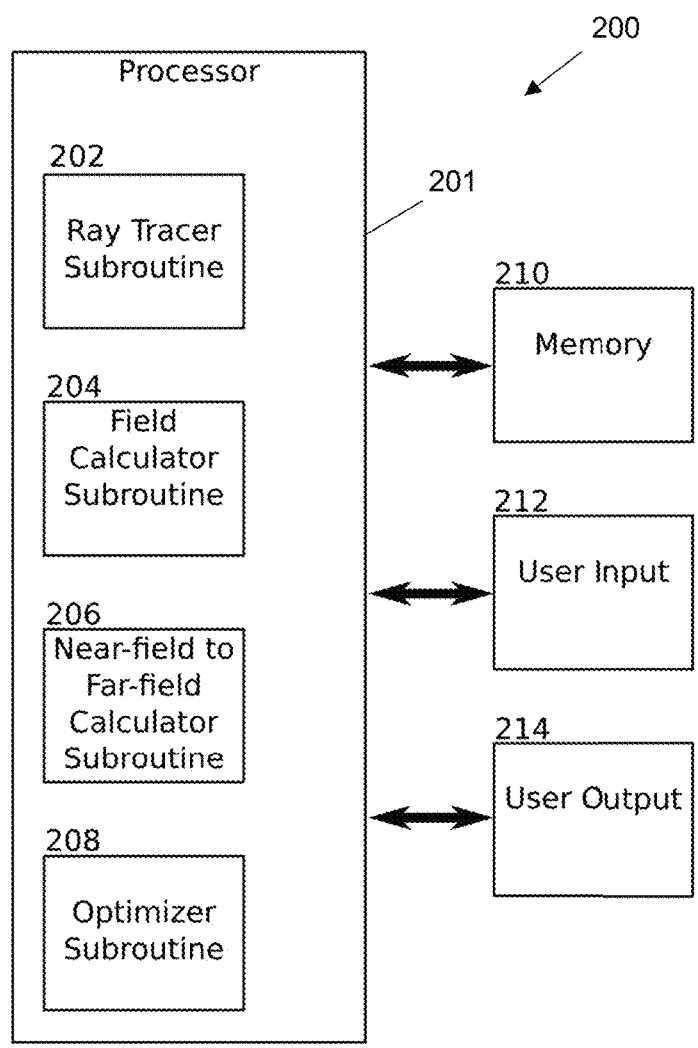
FIG. 5 is a block diagram of a lens design and optimization flowchart.

A system block diagram in accordance with the present invention is shown in FIG. 5. The system 200 generally includes a processing device 201, memory 210, user input 212, and user output 214. The processing device 201 has a ray tracer or similar rapid high-frequency asymptotic simulator module 202 that implements a ray tracer subroutine, a field calculator module 204 that implements a field calculator subroutine, near-field to far-field calculator 206 that implements a near-field to far-field calculator subroutine, and an optimizer 208 that implements an optimizer subroutine. The system 200 implements a methodology for designing antenna lenses.

The phrase "optical design methods" generally refer to techniques such as ray tracing and geometric optics even when applied to microwave frequencies, as distinct from optical wavelengths. The general description of "the lens" properties or "candidate design" in the following text is intended to indicate properties shared by all lenses produced by the design method, as well as properties of a particular design and the incarnation of a fabricated lens.

Figure 6:
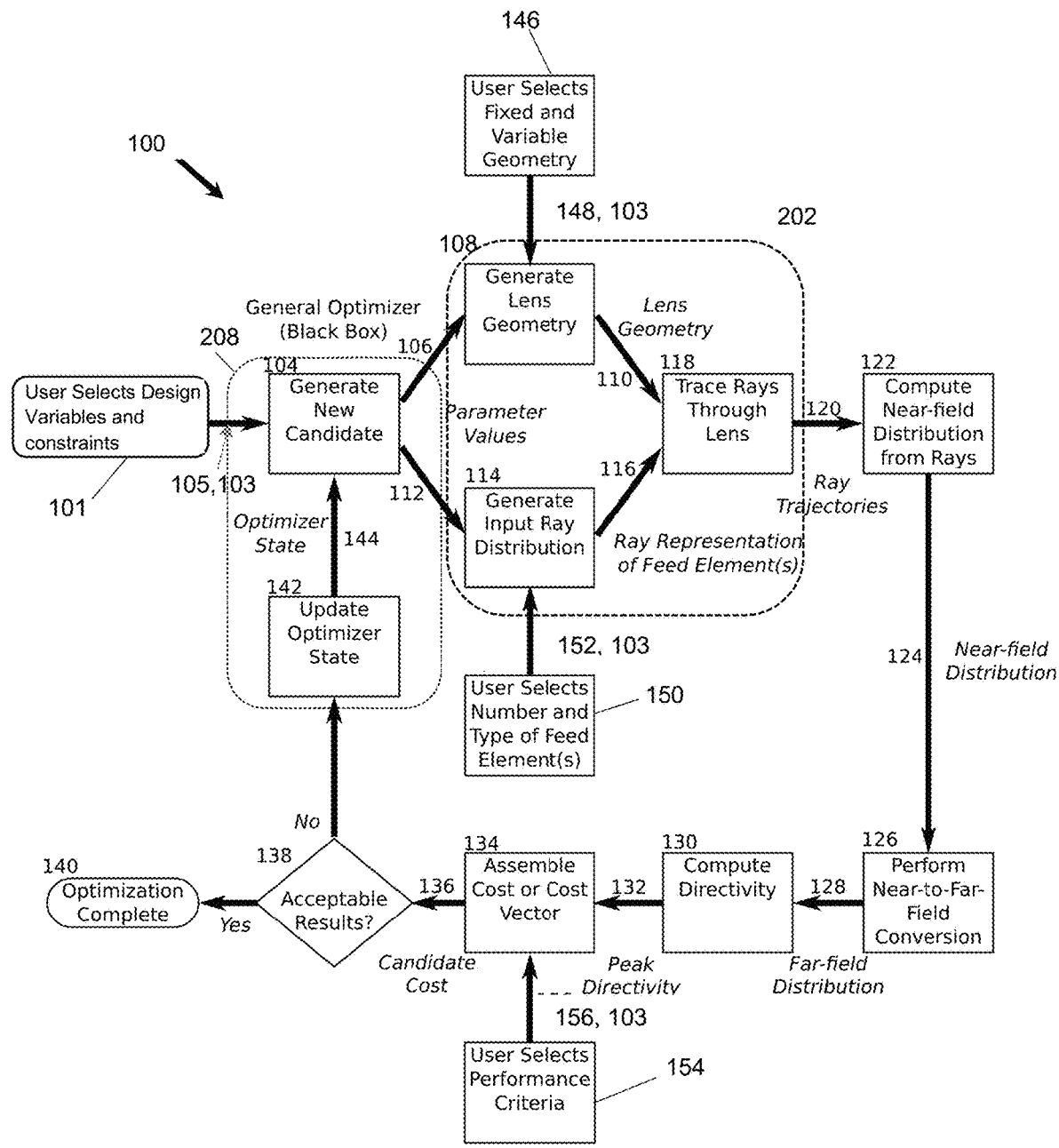
FIG. 6 is diagram for a computer implementation of lens design process.
Figure 7A:
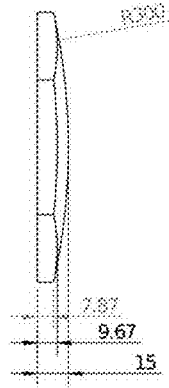
FIGS. 7(a), (b) are side and top views of a hexagonal implementation for a hexagonal tiling of a lens array.
Figure 7B:
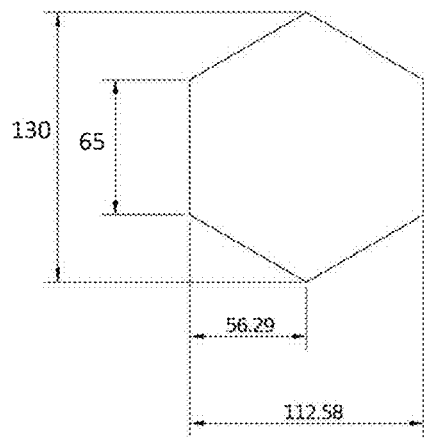
FIGS. 7(c), (d) are side and top views of a square implementation for a regular, periodic tiling of lens array.
Figure 7C:
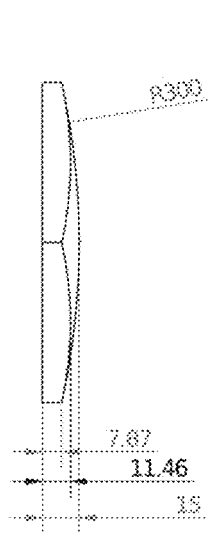
Figure 7D:
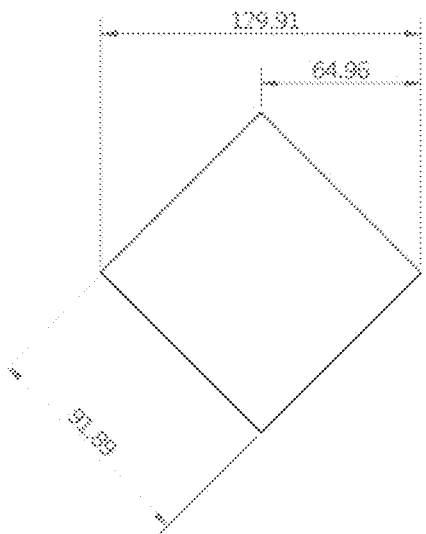

Operation 100 of the system 200 is described with respect to FIG. 6, where the processing device 201 implements the methodology 100 in combination with the memory 210, user input 212, user output 214 and modules 202-208. The optimization process begins when the user selects and inputs the design variables and constraints 105, the fixed and variable geometry 148, the number, type, and configuration of feeds or excitations 152, and the performance criteria 156, all of which together form the design specifications 103. In one embodiment, this information can be specified manually, such as by the user input device 212. The user input device 212 can be, for example, a mouse, keyboard touchpad, or the like. However, it should be recognized that the design specifications 103 can be received from a processing device such as a personal computer, server or other device, even though the inputs will ultimately be manually entered by the user based on expert knowledge of the operational goals for the lens antenna. The optimization variables and associated constraints 101 are the set of those dimensions and/or material properties of the lens antenna that the user desires the optimizer to choose, and represent the subset of the items chosen in data 146, 150. The design specifications 103 jointly define the objective features or characteristics for a desired lens to satisfy a particular application. These objective values are selected by the user at the commencement of the design process and held fixed for each candidate lens.

The design variables 101 can each have independent constraints on their minimum and maximum bound, and particular combinations of variable values are judged to be valid or invalid based on the geometric and material constraints specified by the user. In addition, the initial starting values for each variable, which represent the starting point of the optimizer's search, are also provided and treated as constraints. The user-selected design variables and constraints 101 can be directly provided to the optimization engine 208, or can be stored in memory 210 and retrieved by the optimization engine 208.

The design variables 101 for a lens optimization can fit into several general categories. They can include geometric properties, such as size (e.g., dimensions) and shape (e.g., spherical, cylindrical, aspherical), which can be expressed for example as the lens thickness, which will generally optimized to be small to produce a low-profile design, diameter, front radius of curvature, back radius of curvature, axial feed separation distance from the back of the lens, or transverse feed separation distance from the axis of symmetry. These properties and others, such as the outside shape (e.g., cylindrical, hexagonal) may be specified as a fixed geometric constraint 148 rather than by the design variables 101, if every candidate lens considered should have a particular value.

The fixed geometry constraints can also include material inputs. In general, the lens optimizer can be used for the design of homogeneous lenses as well as inhomogeneous (GRIN) lenses, but the inhomogeneous lenses will be capable of higher performance. In most applications, only isotropic materials should be considered for manufacturing reasons and to avoid the requirement for metamaterials. The set of material inputs can specify the minimum, maximum, and spatial distribution of refractive index within the lens. In contrast, these values are classified as optimization variables if the optimizer 208 selects or determines their value, directly or indirectly through a mathematical expression, independently for each candidate design. For example, the design may be constrained to only use refractive indices between 1 and 3, or the optimizer may be allowed to choose the maximum refractive index used to obtain improved performance or to satisfy manufacturing constraints. Another potential constraint may be placed on the magnitude of the gradient of the refractive index profile, for example, that the refractive index may not change more rapidly than 0.2/mm.

The optimization engine 208 has an internal state 144 stored in memory 210, and feedback characteristics defined by the optimizer update process 142 evaluated by the processor 201. The internal state 144 is defined and updated according to the rules of the particular optimization algorithm used to implement the invention. The optimizer 208 selects new candidate designs outputs candidate design data 106, 112 for that candidate design based on the current optimizer state 144.

The behavior of the candidate lens design, step 106, 112, is quantified and summarized into one or more numbers, such as gain, aperture efficiency, or focusing performance at one or more frequencies or scan angles, the worst gain at any scan angle, or the average energy lost to absorption. This set of numbers is referred to as the cost vector, steps 136, which is distinct for each candidate design and computed 134 based on the particular design variables selected by the optimizer for each candidate. Here, and when referring to optimization results or optimizers, "cost" generally refers to an abstract value or values that consider performance, size, weight, power consumption, and other operational concerns rather than or in addition to monetary cost to build, buy, or operate the system. The resulting cost vector 136 of each candidate design examined will then, at step 142, update the optimizer state 144 according to the rules of the selected optimization engine 208, and allow a new candidate or candidates to be produced and evaluated in turn. The optimization engine 208 receives the design variables and constraints 101 and operates an optimization algorithm to generate using the processor 201 a new candidate antenna lens 104 that it defines by candidate design data 106, 112 based on the set of design variables 101 and the aggregated prior responses contained in the current optimizer state 144.

The current optimizer state 144 will either be random, blank, or set to an initial or expected search area at the beginning of the design process, depending on the rules of the selected optimization algorithm. Each subsequent evaluation of the optimization loop will then update 144 in the method appropriate for the selected optimization engine 208. The user may modify the starting conditions for different optimization runs based on previous results. The optimization-based design is performed in any suitable manner, such as by repeatedly executing the optimization algorithm, which itself repeatedly evaluates the simulation loop described below, for varying optimization variables and the resulting goals until a satisfactory result is achieved. Any suitable optimization algorithm, single or multi-objective, local or global, can be used to implement the design process of the present invention.

The optimizer 208 passes the candidate design data 106, 112 to the geometry generation module 108 and the input ray generation module 114, which generate the lens geometry 110 and incident ray pattern 116, respectively, which together form the input to the ray tracer 118. The geometry generation module 108 and the input ray generation module 114 serve as data conversion modules from the optimizer format 106 and 112 to the ray tracer format 110 and 116.

The geometric constraints 146 and material constraints 150 of the lens are specified by the user prior to beginning the optimization process, and are stored in memory 210 for future access. The geometric constraints 146 of the feed, include the magnitude, phase, and density distribution, as well as the number, orientation, and location of the feed(s) relative to the lens. That data 146, 150 can then be transmitted or retrieved from memory 210, steps 148, 152, for use in generating the lens geometry 108 and generating the input ray distribution 114, respectively, using the processor 201. The geometric and material constraints 146, 150 represent limits on the dimensions and other properties of the design that are provided to the ray tracing engine 118. The limits on dimensions and other properties of the design are evaluated and enforced prior to executing the ray tracing engine 118.

The user-specified settings for fixed and variable geometry 146, 148 include the form of the parameterization equation for the refractive index gradient (polynomial, spline, etc.) and the number and numeric ranges of the optimization variables, the lens thickness, diameter, and surface curvature, the axial focal length, and the range of acceptable refractive index values. The user-specified settings for the feed elements 150, 152 include the particular type of feed antenna with corresponding far-field radiation pattern, the number of angular scanning locations to optimize, the feed radial locations while scanning. Of interest to the outcome of the design is the number, position, types, and orientation of the feeds 152 used for the optimization; the positions of the feeds are placed by the user such that beams at sufficiently wide angles are realized to adequately cover the desired field of regard. Jointly maximizing the performance at each of the discrete feed locations is then equivalent to optimizing the antenna across the entire field of regard. Selecting feeds further separated from the center of the lens produces an antenna with wider field of regard, while using only feeds near the center of the lens produces an antenna with a narrower field of regard.

At step 108, the system 200 generates a model 110 of the geometry and material properties for the new candidate lens identified at step 104, such as a cylindrical lens of diameter 10 cm with front and back radii of 40 cm, and a quadratic radial index distribution, based on the fixed and variable geometry specification 148. At step 108, the system 200 receives the user-selected lens configuration 148, either directly from user input 212 or from memory 210. The set of geometry specifications 110 is then output and provided to the ray tracing engine 118.

At step 114, the system 200 generates a model 116 of the far-field radiation pattern for a real feed antenna for the new candidate lens identified at step 104, such as an open-ended waveguide or patch antenna, based on the location(s) of the input sources 152. At step 114, the system 200 receives the user-selected number and type of feed elements 152, either directly from the user input 212 or from memory 210. The set of input rays 116 is computed to model the far-field radiation pattern of the feed beneath the lens antenna. For example, a low-gain directive feed, such as a patch antenna, has a radiation pattern that may be well-approximated by a cosine function.

The ray representation 116 of that feed would be a collection of rays radially emanating from the origin at uniform angular separation, where the relative magnitude of each ray is set according to the cosine of the angle between ray and the z-axis. A plurality of independent ray distributions may then be generated by the processor 201 based on a stored far-field radiation pattern from memory 210 for one or more frequencies and feed antenna locations that approximate the continuous field distribution created by a plurality of feed antennas. The input ray distributions are then stored in memory 210. The selection of feed antenna is one of the user-specified geometric constraints 150 and as such will affect the design, but the design method is not limited to a single type or class of feed antenna.

At step 118, the ray tracer module 202 receives the lens geometry and material data 110 from step 108, and the ray representation of feed elements 116 from step 114. The ray tracer module 202 then initiates the ray tracer engine 118 to model the behavior of the input rays 116 as they propagate through the candidate lens defined by 106, 112 to produce a set of ray trajectories 120, which are then stored in memory 210. A ray trajectory is the computed path along which each idealized ray from the incident ray distribution 116 is predicted to travel within the simulation model 110. The ray trajectories 120, in addition to tracking the geometric path through the model, include polarization, phase, and magnitude data.

Although the system is described here as rays originating at the feed and propagating through the lens, it is apparent to one skilled in the art that by antenna reciprocity any properties determined through this calculation and design process are equally valid for an antenna in receive mode rather than transmit.

The ray tracing engine 118 predicts the behavior of a particular lens design candidate during the optimization. This can be achieved, for example, by any suitable ray tracer such as a Geometric Optics ray tracing engine 118 that approximates the propagation of radio waves and/or light as idealized rays. In this case, the behavior of the lens is characterized by the aggregate behavior of the set of input rays as they propagate into and through the lens and surrounding geometry. Different implementations of the ray tracing algorithms may be used by the ray tracing operation 202 of the processing device 201, to compute the properties of the candidate lens without changing the fundamental qualities of the disclosed design methodology. Each ray is considered independently, and is modified as it propagates throughout the simulation domain according to the local refractive index distribution. Evans, James, "Simple forms for equations of rays in gradient-index lenses," Am. J. Phys 58, no. 8 (1990): 773-778. Ray tracing is an approximate technique that is quite accurate in practice for gain and phase front prediction purposes even for microwave wavelengths when used appropriately and orders of magnitude faster than a full-wave solver such as Finite-Difference Time-Domain (FDTD) or the Finite Element Method (FEM). A full wave solver is still necessary for final verification of the design.

Once all of the incident rays have been fully propagated such that the rays have no more interactions with the simulation geometry, then the set of output ray trajectories 120 is sorted to find the specific ray segments that exit the lens. The field calculator 204 performing step 122 then truncates those final ray segments to an evaluation surface, generally a plane, past the outside surface of the lens. The truncated ray data is then represented as a nonuniformly-spaced collection of points on the evaluation surface; the phase, magnitude, and polarization of the field at each point are computed from the ray trajectories 120. The field calculator 204 then interpolates in the processor 201 and stores in memory 210, a uniformly-spaced grid of phase, magnitude, and polarization data of the ray intersection points onto the evaluation plane. The representation of the phase, magnitude, and polarization data is then changed to store complex-valued frequency-dependent near-field electric field distribution 124.

One feature of the invention is the interaction between the optimizer 208 and the ray tracer 202 and ray tracer engine 118, with the use of microwave optimization metrics to classify the performance of a lens candidate based on the ray tracing outputs. Any suitable known ray tracer and optimizer can be utilized in the invention to provide independent calculations the ray trajectories 120, then the fields 124, the near-field to far-field calculation 126, computation 130 of a far-field radiation pattern 128 into directivity 132, and directivity as an optimization goal 136. The combination of the optimizer 104 and ray tracer engine 118 to design an antenna with a wide field of regard by mutually maximizing directivity (or, equivalently, aperture efficiency) for multiple beam angles based on the ray-tracing results of multiple distinct feeds allows for rapid, effective design of microwave-frequency gradient-index lens antennas with a wide field of regard.

The combination of optical ray tracing to optimize a microwave lens by directly computing directivity and aperture efficiency for multiple field angles by exciting multiple excitations at different physical locations, frequencies, or polarizations represents one unique aspect of the method and system of the invention to obtain the high on-axis and angular antenna performance. The efficient design of antennas, particularly high-gain antennas, requires evaluation of the directivity and/or aperture efficiency, which have not previously been provided as outputs of ray tracing of GRIN lenses. Prior art has focused on lenses at optical wavelengths, and thus has computed outputs (such as focal spot size, focal length, modulation transfer function, point spread function, etc.) that are not relevant for the design of microwave antennas. The design process is typically performed on a general-purpose computer for efficiency, but can require judgement from a skilled human in the loop to evaluate the relative quality of candidate designs, and to determine if a particular design meets the desired performance criteria.

At step 126, the near-field to far-field subroutine 206 then determines the far-field electric field distribution pattern 128 due to the near-field distribution 124 using the method described by Balanis, C. A. Balanis, "Antenna Measurements", Antenna theory, Analysis and Design, 3rd ed. Wiley New York (2005): 1001-1047. The far-field radiation pattern is needed to evaluate performance of microwave antennas. In the illustrative embodiment, this can be done at the output of the candidate lens for each of the plurality of input sources corresponding to the feeds, and the results are stored in memory 210. The antenna directivity is computed by the processor 201 from the far-field data 128 stored in the memory 210 according to any suitable means, such as the equations described by C. A. Balanis, "Antenna Measurements", Antenna theory, Analysis and Design, 3rd ed. Wiley New York (2005): 27-132. This is done by integrating the far-field pattern 130 to produce the directive gain or directivity (known to be the peak-to-average ratio of the far field pattern over all angular space) and picking the maximum value as the peak directivity 132 of the candidate antenna for each of the plurality of independent feeds. Each feed pattern produces a peak directivity as a number. In some cases, the peak directivity is the main factor. However, in other cases, the criterion may be to maximize the minimum of the peak directivity as the beam is scanned over the field of regard.

Gain and Aperture efficiency for the candidate lens can be computed by the processor 201 from the directivity pattern 132 in any suitable manner, as will be understood in the art. The directivities 132 are used together with the performance criteria 154 in the processor 201, step 134, to determine a cost vector or single cost value 136 (depending on the needs of the optimizer). The optimizer evaluation is based on the user's specification of the objective performance and standard criteria known in the art may be employed to assess the "difference" between specified and achieved performances based on weighted criteria such as aperture efficiency, directivity, scan behavior, bandwidth, polarization, efficiency, etc.

The performance criteria 156 for an optimization represent minimum thresholds of performance that are compared by the optimizer 208 and the user to the outputs of the simulation engine, and are dependent on the specific application. The performance criteria 156 for this design process based on the ray tracing/simulation engine 202 and associated post-processing calculations include such parameters as directivity, gain, relative cross-polarization levels, axial ratio, aperture efficiency, receiver noise temperature, field of regard, and system thickness. The criteria 156 generally fall into the categories of antenna performance (gain, aperture efficiency, etc.) or system characteristics (overall thickness, size, relative financial cost, etc.).

Depending on the exact setup, the user may specify bounds or constraints on the parameters 101 and performance characteristics 132 to limit or guide the search space of the optimizer, and the user may specify target values/objectives for the optimizer to try to meet. These criteria are selected by the user, step 154, to adequately describe the operational requirements of a successful design. Based on the results of one or more optimization cycles, the thresholds of acceptable values may be updated by the user to represent more realistic assumptions about the capabilities of a lens given the other design constraints. The information 156 can be sent directly from the user input 212 for use at step 134, or can be stored and retrieved from memory 210.

The system 200 then determines, at step 138, if the cost results 136 satisfy the design constraints 103, which are retrieved from memory 210, by assessing the "difference" between actual and desired performance and cost based on well-known comparison methods such as least squares, minimax, or other. The criteria, design constraints 103 and particularly 156 such as size, weight, tolerances, manufacturing cost, and limitations on the variability of dielectric constant gradients and comparison method are established by the user. As used in this document the term "cost" refers to a generalized optimization cost—a difference between achieved and objective performance, not a financial cost.

If the cost vector 136 satisfies the design constraints 103, step 138, then the optimization terminates, step 140, and the system 200 outputs the results 214, and allows the user to verify and confirm the results with additional simulations. The results 214 will depend on the operation of the specific optimization algorithm selected, but will generally include a list of the top-performing candidate designs (in addition to the best design that satisfies the threshold), where each design is described as the set of design variable values 106, 112 and the cost vector 136. Additional information, such as the raw simulation data 120, 124, 128, 132 from which the cost vector was computed may also be included.

On the other hand, if the cost results 136 do not satisfy the design constraints 103, step 138, then the internal state of the optimizer in memory 210 is updated, step 142, by the processor 201 in the particular way of the selected optimization algorithm, and the cycle repeats. The particular internal state 144 and methods of using and updating that state 144 are specific to each optimization algorithm. For example, in the CMAES algorithm, the internal state 144 is the specification of a multivariate gaussian probability distribution, represented as the covariance matrix and the distribution mean, from which samples are taken to form the candidate design. For each candidate design or group of candidate designs, the mean and covariance matrix are updated to have a higher probability of excluding bad samples and including good samples. This has the effect of shifting, rotating, and shrinking the multivariate normal distribution as the optimization proceeds. Different optimization strategies, such as genetic algorithm and particle swarm, will have different internal state and update characteristics peculiar to their operation.

This result of using directivity 130 computed from the ray-tracing outputs (i.e., the far-field distribution 128) at multiple beam angles to optimize the optical response of the GRIN lens represents the best way to obtain a high-aperture-efficiency all-dielectric gradient-index lens antenna due to the high evaluation speed (typically 100-1000 times lower computational effort than a full-wave model) to consider each candidate design.

The high-directivity, wide field of regard lens obtained from the design process above is a flexible building block for a large number of potential antennas. This process produces the design for a single lens that meets the user-specified constraints and performance goals specified at the start of the process. The resulting lens can be applied to different applications and in different configurations. Depending on the constraints and performance goals, the single-lens output of the design process may be used as-is as a high-gain antenna. Alternatively, constraints that specify a lower directivity and smaller size for a single lens will produce a lens design that is suitable for tiling in a planar or non-planar configuration and operation as a phased array antenna with electrically-large feeds. A plurality of small lenses can be combined to form a low profile high-gain phased array that merges the large, low-cost aperture of the optimized lens antenna with the scanning flexibility and control of a phased array. Using electrically-large pattern-reconfigurable array elements (multi-wavelength elements) reduces the volume, weight, and depth compared to a single-lens antenna while substantially reducing the cost and complexity of a conventional phased array. Extending the array to a dome can be used to increase the achievable field of regard above that of an individual lens by switching power between subsets of active lens elements.

The optimizer 102 used in the lens design process can make use of any suitable algorithm, for example a multi-objective stochastic optimization algorithm, such as CMAES (Covariance Matrix Adaptation Evolutionary Strategy) (Gregory, Micah D., Zikri Bayraktar, and Douglas H. Werner, "Fast optimization of electromagnetic design problems using the covariance matrix adaptation evolutionary strategy," IEEE Transactions on Antennas and Propagation 59, no. 4 (2011): 1275-1285, (GA) Genetic Algorithm, Weile, Daniel S., and Eric Michielssen; "Genetic algorithm optimization applied to electromagnetics: A review." IEEE Transactions on Antennas and Propagation 45, no. 3 (1997): 343-353); and Hadka, David, and Patrick Reed, "Borg: An auto-adaptive many-objective evolutionary computing framework," Evolutionary computation 21, no. 2 (2013): 231-259, or PSO (Particle Swarm Optimizer), Rahmat-Samii, Yahya; "Genetic algorithm (GA) and particle swarm optimization (PSO) in engineering electromagnetics" Applied Electromagnetics and Communications, 2003, ICE-Com 2003, 17th International Conference on, pp. 1-5. IEEE, 2003; Moore, Jacqueline, Richard Chapman, and Gerry Dozier. "Multiobjective particle swarm optimization" in Proceedings of the 38th annual on Southeast regional conference, pp. 56-57. ACM, 2000).

These optimization algorithms are application agnostic, and can be applied to a number of different design domains by means of a well-defined interface of a numerically-computed cost function, and a set of optimization parameters or variables. The cost function in our case consists of the evaluation loop of steps 108/114, 118, 122, 126, 130, 134, 138 that transforms a set of design variable values 106/112 into a cost vector 136. The operation and use of optimization algorithms for engineering design applications are well-understood and documented in the literature noted above. The optimization algorithm and accompanying numeric calculations are generally automated and implemented as a software program on a general-purpose processing device, such as a computer, having a memory. Individual aspects of the optimization, which might include adjustments to the input parameters and optimization settings, may be made manually by a human-in-the-loop.

Additional Design Considerations

Figure 1C:
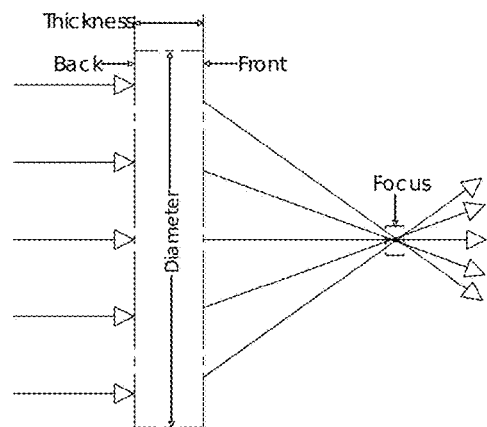
FIGS. 1(c), 1(e) show the behavior of an arbitrary lens showing reception of a plane wave, including the response of a lens to incoming plane waves that are on-axis (normal to the lens) or off-axis (arriving at an angle to the lens normal)
Figure 1D:
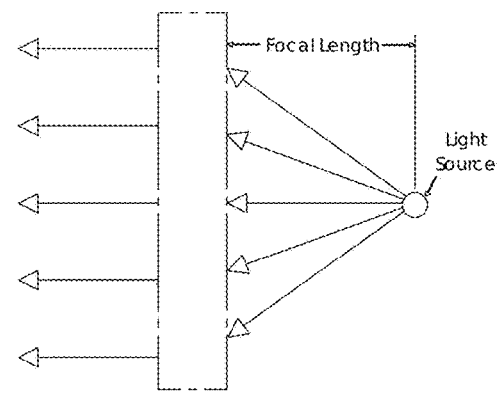
FIGS. 1(d), 1(f) show the collimation of point sources for the lens in transmission mode from feed locations that produce an on-axis beam (FIG. 1(d)) and off-axis (FIG. 1(f))

For example, the following lenses can be designed by the system 200 by the user specifying the appropriate design constraints 103. Of course, additional suitable lenses other than those listed here may be designed by providing the appropriate constraints. The lenses described in this disclosure can, for example, function as collimators to facilitate communication links between a remote node and a feed antenna or source near the lens. Without considering for the moment the specifics of the lens construction, rays of microwave energy (light) from a distant source are collected by the lens and directed to a focal point, as in FIG. 1(c). Since the dielectric lens antenna is a reciprocal electromagnetic device, it is evident as in FIG. 1(d) that a microwave source placed at the focal point will produce a collimated beam of parallel rays emanating from the front of the lens.

Figure 1E:
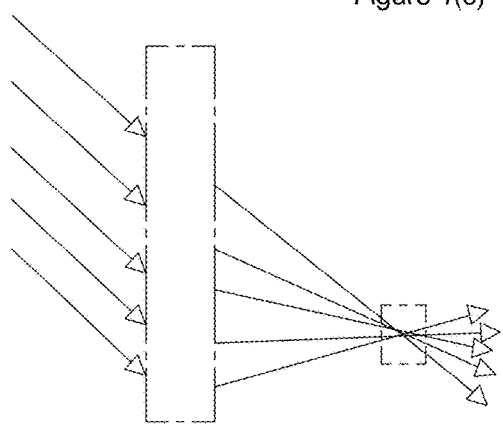
Figure 1F:
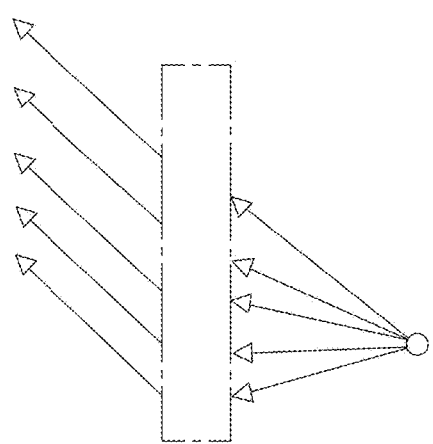

Moving the location of the source (FIG. 1(f)) in the radial direction is equivalent to changing the angle of the incident rays (FIG. 1(e)) and allows a lens antenna to be used as a beam steering or scanning antenna. The location of the source can be fixed in order to communicate between two fixed stations, but must be dynamically moved if the orientation or location of either station is not fixed. The movement of the source can be accomplished mechanically with electrically-controlled actuators that move the feed or feeds in the focal region, or as a plurality of closely-spaced feeds that can be independently electronically enabled or disabled. Scanning in the latter case includes repeatedly switching power between or among adjacent feeds or groups of feeds to smoothly vary the direction of the beam. It is evident that, as an optical device, multiple beams are readily formed by simultaneously exciting multiple feeds in a way similar to reflector antennas. This allows the antenna to track and communicate simultaneously with multiple remote stations in a mobile or non-geostationary satellite orbit (NGSO) environment.

The magnitude and phase excitation of the lens as well as the focal point can be improved by using a feed cluster of multiple elements rather than a single feed to generate a single beam. For example, a hexagonal cluster of seven elements is formed by a feed element and its six neighbors. The number of elements and the relative magnitude and phase difference between elements within the currently active cluster can be used to tailor the electric field distribution or aperture taper of the lens in a similar way as is commonly used for reflector antennas. The use of overlapping feed clusters rather than single feeds can allow finer control over beam directions and such properties as sidelobe levels with somewhat increased complexity of the feed and switching network. The use of microwave beam-forming networks such as Rotman lenses and Butler matrices are one solution to apply the proper magnitude and phase offsets to the cluster elements.

The field of regard is the range of incident angles for which the lens will focus the incident electromagnetic wave to an acceptably small focal spatial region or volume. Alternatively stated, it is the range of angles of radiated beams having acceptable properties such as directivity, gain, sidelobes and polarization that can be generated by feed antennas at different locations behind the lens. Such change of the feed position, whether by physical movement of the feed or by switching among a number of feeds in the focal region produces a beam that is steered or scanned over the angular range or field of regard. Simultaneous activation of a number of feeds can yield a sensor that can "see" sources over a wide field of regard at a given instance of time.

Figure 2A:
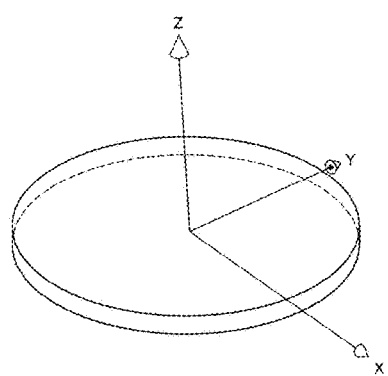
FIGS. 2(a), (b), (c) show lenses having different example side boundary profiles, namely circular, hexagonal, and square, respectively.
Figure 2B:
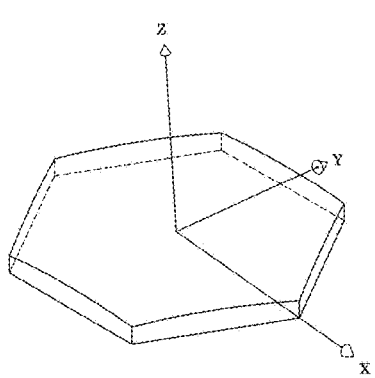
Figure 2C:
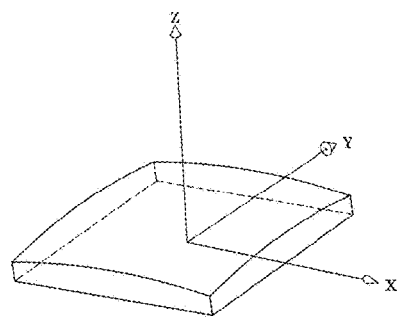
Figure 3A:
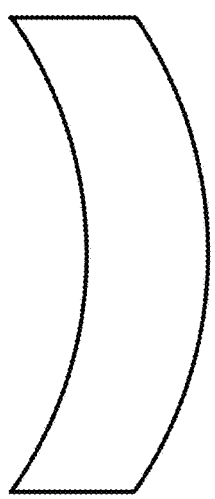
FIGS. 3(a), (b), (c) shows example geometries for a lens
Figure 3B:
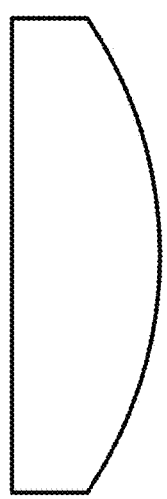
Figure 3C:
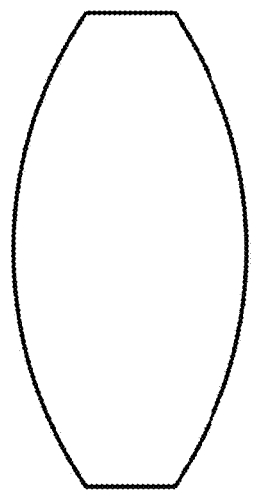

A lens has front and back surfaces that bound a region containing some specified material or materials. The back surface of the lens is defined to be the surface closest to the focal point. The described lens apertures can be built in different shapes depending on the application without changing their fundamental behavior, such as but not limited to, circular (FIG. 2(a)), hexagonal (FIG. 2(b)), and square (FIG. 2(c)) outlines. The cross-section of the lens can also take on different outlines, but is in practice limited to those shapes that produce desirable radiation properties over a wide field of regard, such as a meniscus lens with negative back and positive front surface curvature in FIG. 3(a), a plano-convex lens with flat back surface and positive front surface curvature in FIG. 3(b), or a convex lens with positive front and back surface curvatures in FIG. 3(c).

Figures 4A, 4B:
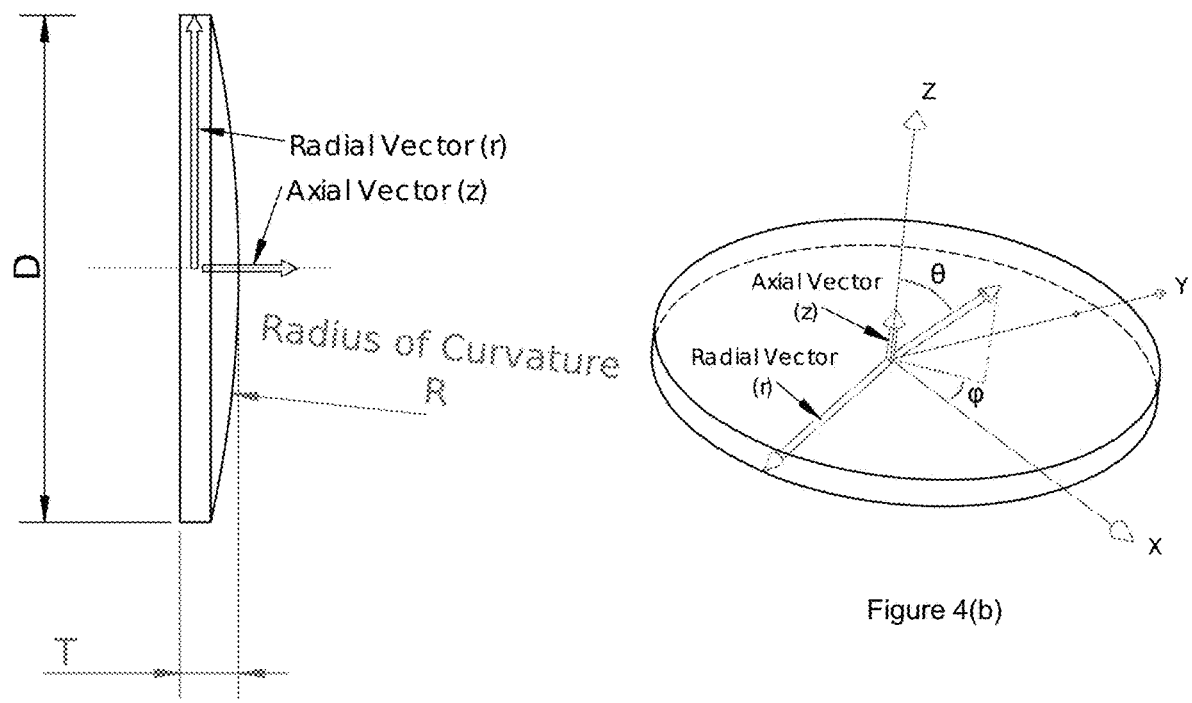
FIGS. 4(a), (b) show an example coordinate system and dimensions for a lens.

The geometry for a plano-convex lens, which is considered as the example in the rest of this document, is provided in FIGS. 4(a)-(b). The back face of the lens lies in the x-y plane, while the lens axis is parallel to the z-axis in conventional Cartesian coordinates. The outer lens geometry is specified as a diameter D, the radius of curvature for the front surface R, and the total lens thickness T.

The lens is not limited to operation over a narrow frequency range, but the scanning response and directivity of an antenna based on a suitable lens-feed arrangement are chosen for optimal performance for a given range of frequencies. The lens will continue to operate at higher and lower frequencies, but the overall system efficiency depends on the feed antenna and lens combination.

The dimensions of the lens depend on the specific desired frequency of operation, but the lens design itself is independent of and can be scaled to operate identically at any base frequency, including but not limited to the UHF-band, L-band, C-band, X-band, the Ku, K, and Ka satellite bands, and higher frequencies such as the V-band and Q-bands and for applications such as 4G and 5G. The physical implementation of a lens design will vary with the design frequency. Finer tolerances and spatial and material discretization are required for higher frequencies and/or physically larger lenses, which will produce an effective upper limit on the operational frequencies due to limitations in available manufacturing tolerances. A lens with good wideband operation is obtained by designing at the highest frequency of interest, while confirming the good response at lower frequencies once the design is complete.

To illustrate the invention for the sake of this document, all dimensions are provided for a non-limiting example lens operating at a central frequency of 12 GHz. Scaling the physical size of the lens is equivalent to changes in design frequency, and vice versa. This selected band is chosen for clarity of description and does not represent a limit, fundamental or otherwise, on the applicability or usefulness of the lens. All of the dimensions of an equivalent lens meant to operate at a different frequency should be scaled in a manner well understood in the art according to the ratio of the new free-space design wavelength relative to the free-space wavelength at 12 GHz.

The lens refractive index is specified and parameterized during the design process as a continuous function that appears as an inhomogeneous gradient at the outset. The gradient is later discretized to "layers or subsections" of materials, each "layer or subsection" being homogeneous and having its own dielectric constant, for fabrication. Computer representations of the continuous distribution may incorporate discrete material values, but the discrete values are very finely separated, and, while the computed index profile may be functionally equivalent to an ideal, continuous distribution, a physical implementation with discrete layers will have a more limited resolution. One computer representation of the lens refractive index profile is a 20-term cylindrically-symmetric polynomial of the r and z variables (as illustrated in FIG. 3), with the origin at the back center of the lens. The alpha terms represent parameters that are set as part of the design process.

$$n(r, z) = \alpha_0 + \alpha_1 r^2 + \alpha_2 r^4 + \alpha_3 r^6 + \alpha_4 z + \alpha_5 z^2 + \alpha_6 z^3 + \alpha_7 z^4 +$$
$$\alpha_8 r^2 z + \alpha_9 r^2 z^2 + \alpha_{10} r^2 z^3 + \alpha_{11} r^2 z^4 + \alpha_{12} r^4 z + \alpha_{13} r^4 z^2 +$$
$$\alpha_{14} r^4 z^3 + \alpha_{15} r^4 z^4 + \alpha_{16} r^6 z + \alpha_{17} r^6 z^2 + \alpha_{18} r^6 z^3 + \alpha_{19} r^6 z^4$$

Although an equation for the refractive index profile is described here, a similar parametric equation can also be written for the dielectric constant. Specifying either one of the refractive index or dielectric constant is equivalent to specifying the other.

Increasing or decreasing the number of terms in the polynomial, changing the form of the polynomial to a product rather than a sum, or changing the powers to change the set of included terms, does not fundamentally alter the lens or design method. Alternative representations of the refractive index within the lens (for example, splines or other surface-based representations, sinusoids, Bezier surfaces, Zernike polynomials, discontinuous or piecewise continuous functions, etc.) do not change the fundamental aspects of the design paradigm, either. The continuous distribution is applied to the entire volume of the cylindrically-symmetric lens by interpreting the function in the cylindrical coordinate system, although modified methods that do not assume cylindrical symmetry may be useful in some circumstances.

For ease of fabrication, the constructed lens has thin isotropic homogeneous dielectric layers that fit together to form a solid volume. The number, shapes, and constituent materials of the layers are variable to meet the needs and constraints of the manufacturing process and available material systems. The lens can be constructed from a variety of materials, provided that the refractive index/dielectric constant is within suitable tolerances and the dielectric loss tangent is sufficiently small. Each effectively homogeneous layer of the lens may be constructed from a single material, or as an aggregate of high-index and low-index sub-regions arranged to produce a homogeneous response within the frequency band of interest.

Depending on the manufacturing method and the available materials, the fabricated lens may be discretized from the original continuous design according to values of refractive index, convenient spatial regions such as equal-thickness layers, or both. Spatial discretizations may follow contours defined by the index gradient, or may be defined based on convenient geometric assembly such as sheets, bars, cubes, or other shapes of different materials.

When considering construction using laminar layers of discrete material types, this lens can be implemented with different strategies for determining the boundary layers. The different discretization strategies may offer advantages when considering a fabrication strategy, but do not alter the overall operation of the lens.

The lens can be discretized into regular layers of uniform thickness, irregularly-shaped layers of uniformly-spaced refractive index, or irregularly-shaped layers of uniformly-spaced dielectric constant. When the layers are thin enough (which must be determined by measuring the behavior of a prototype or performing a full-wave computational simulation of the structure), the lens behaves identically regardless of the discretization model selected, but one discretization method or another may yield better results when minimizing the total number of layers. Thinner layers with finer dielectric constant gradations are required for lenses operating at higher frequencies, or for physically smaller wavelengths. Lenses with a fine discretization chosen for a high frequency will operate well at lower bands, but coarse discretizations such as for lower frequency designs may suffer performance losses if operated well above their design range.

To minimize the scattering losses from the front and back lens surfaces, an anti-reflective coating (ARC) may be included. Some optimized lens designs that have near-unity refractive indices at their front and/or back surfaces may be able to omit the ARC, but this is an unusual case. Different ARCs can be applied without changing the fundamental lens design and characteristics. The coating can be included in the design and optimization process as well as integrated into the same manufacturing step as the lens, or it can be designed and applied using a different method. ARC design methodologies used for homogeneous optics may, with some limitations, be applied to GRIN lens elements (Morgan, Kenneth L., Donovan E. Brocker, Sawyer D. Campbell, Douglas H. Werner, and Pingjuan L. Werner. "Transformation-optics-inspired anti-reflective coating design for gradient index lenses." Optics letters 40, no. 11 (2015): 2521-2524) with reasonable results. A quarter-wave transformer based on the surface index of the lens, the simplest possible ARC, is fairly effective.

Electrically thin lenses may generate reflections internal to the lens, as well as at the surfaces, due to the high rate of change of the refractive index with respect to position compared to the wavelength. These internal scattering losses cannot be addressed by applying an ARC, but can be reduced by including limits on the rate of change of the refractive index in the optimizer.

Example Applications

The disclosed design method and associated design outputs of the method can be used for a number of possible applications, for example: (a) high-speed point-point and point-multipoint data connections; (b) 4G and 5G cellular communications; (c) unmanned aerial systems (UAS), including drones, unmanned aerial vehicles (UAVS) for military, civilian, and commercial use, commercial aircraft to provide on-board Internet connectivity; (d) SATCOM on-the-move; (e) communications (one-way or two-way) with satellites in non-geostationary orbit (NGSO) and also allowing multiple beams for "make-before-break" connections with either GEO or NGSO constellations; (f) space-based satellite antennas for generating spot or broad beams on the earth; (g) receive-only satellite terminals Maritime mobile satellite communications (ships, yachts); (h) land mobile satellite communications (bus, train, truck, RV, car); (i) radar; (j) direction-finding; (k) signals intelligence and interception. These applications include use for full-duplex (i.e., frequency-division duplex (FDD) simultaneous transmit/receive mode, and half-duplex operation.

These applications have varying requirements, and operate across a variety of microwave channels. A single or small number of lens designs can be extended to cover these applications by tiling a plurality of lenses to form a scalable, conformal phased array of electrically large elements that can be constructed with nearly arbitrary size and shape. The array can easily be conformed to the shape of the underlying structure, such the surface of a cylinder when mounting on the body of an aircraft, and additional lenses may be added to extend the aperture size of the terminal. In some situations, such as a space-based antenna and aircraft-mounted antennas, specialized environmental constraints would need to be satisfied by the lens before it could be used.

Since each lens in any of these example applications (communicating or pointing to a terrestrial or satellite target) will have multiple feeds, a control system will be required to determine which feeds should be used, and which phase or time delays, for each lens in the array in order to generate the required radiation pattern to acquire and track the desired signal. This control system may be composed of fixed circuitry or using software-controlled processor. The beam-forming system itself could be constructed with discrete phase shifters or time-delay units, or could make use of beam forming networks such as Butler matrices or Rotman lens circuits. This control system may be substantially manual, in that the user of the terminal is required to input a desired scan direction, or the system may be paired with a global positioning and inertial motion unit to allow automatic acquisition, tracking, and reacquisition of a satellite or other target with known trajectory. In every case, the feeds selected for a lens or array will need to be appropriate for the operation of that system, including the operational frequency, beamwidth, and efficiency. In some cases, multiple adjacent feeds may be excited with either a magnitude or phase taper in order to improve the aperture illumination of the lens and thereby improve aperture efficiency.

Each application will have some network interface specification from the antenna to the modem or other signal processor, with potential downconverter and baseband interfaces that must be appropriately implemented. In some cases, the modem or network interface itself will include the steering information for the terminal and act as the antenna controller.

Example Embodiments

An electrically small lens (about 5λ or five wavelengths where λ is the wavelength) is suitable for use as an array element for a phased array of such lenses having far fewer active elements compared with a conventional phased array.

The optimization process described above is executed in order to design a suitable candidate design. See FIG. 4 for the lens geometry.

The first steps of the design process are for the user to select the performance goals 154, geometric and material constraints 146, and design variables and constraints 101. The selections for the present example embodiment are as follows.

Performance goals (step 154): the lens is designed for Ku-band operation at 12 GHz, and is desired to have better than −5 dB aperture efficiency for all beams formed within a cone with apex angle (or, field of regard) of 45 deg. The peak directivity for a 100% efficient aperture in dB is given by the equation: $Directivity_{max,DB} = 10*\log_{10}(4*pi*A/lambda^2)$. For a lens with the geometric dimensions cylindrical aperture diameter D=13 cm, the directivity representing peak aperture efficiency is 24.2 dB. The performance goal for this design is to minimize the deviation for the directivity corresponding to each feed from 24.2 dB, allowing the candidate design cost for each respective feed to be computed as in the equation: $Cost[feed] = 24.2 - Directivity_{max,dB}[feed]$.

Geometric constraints (step 146): For the geometric constraints, the back surface of the lens is flat, the front surface is convex spherical with a radius of curvature of R=30 cm, and the thickness of the lens at the apex of T=1.5 cm.

Feed constraints (step 150): Three open-ended WR75 waveguide feeds are selected as the excitations for this design, located at the center of lens at a focal length along the z-axis of 5 cm, and separated radially along the r-axis from the lens center by 0 cm, 1.2 cm and 2.4 cm. Shorter focal lengths significantly improve the performance of the system when considering spillover, as more of the energy emanating from the feed is captured by the lens. It would be equally valid to use some other feed, such as a dual-polarized patch antenna, a wideband feed such as a horn or Vivaldi antenna. The feed could be either linearly or circularly polarized, as the lens does not introduce a significant cross polarization. Even though only three feeds are used here, additional feeds may be added to fully tile the region underneath the lens to allow scanning the beam anywhere within the upper hemisphere. In addition, multiple feeds may be enabled simultaneously with separate signals to produce multiple independent beams.

Material constraints (step 146): the material gradient is represented in the design process as a 21-element polynomial in r and z where the r and z variables are interpreted in units of meters, as described previously, for the refractive index, where the 21 coefficients are assigned to be variables to be optimized by the optimizer with optimization ranges between positive and negative 10. The resulting refractive index profile within the lens is constrained to refractive indices between 1 and 4.5 to ensure that the resulting design that is produced as a result of running this process is manufacturable.

Once the performance goals, geometric and material constraints, feed configuration, and optimization variables have been selected as described above at steps 101, 146, 150, and 154, the optimization process begins as illustrated and described in FIG. 6. The optimizer repeatedly generates new combinations of the 21 optimization variables, which are used to generate a refractive index profile within the user-specified lens geometry. The Ray Tracing engine 118 then loads the material and geometry data from memory 210 to compute the ray trajectories 120. The ray trajectories 120 are then transformed into near-field electric-field spatial aperture distributions 124, the near-field distribution 124 transformed into a far-field angular distribution 126, 128, which is then used to compute the directivity of the radiation pattern produced by each of the three input feeds, step 130. The optimizer will typically require many thousands of evaluations of this design loop until the results converge to reasonable values which are output to the user for evaluation. The optimization loop, since it relies on random number generation to perform the evaluation, is not a deterministic process, and is executed by the user several times to ensure that the best design is located.

Figure 8:
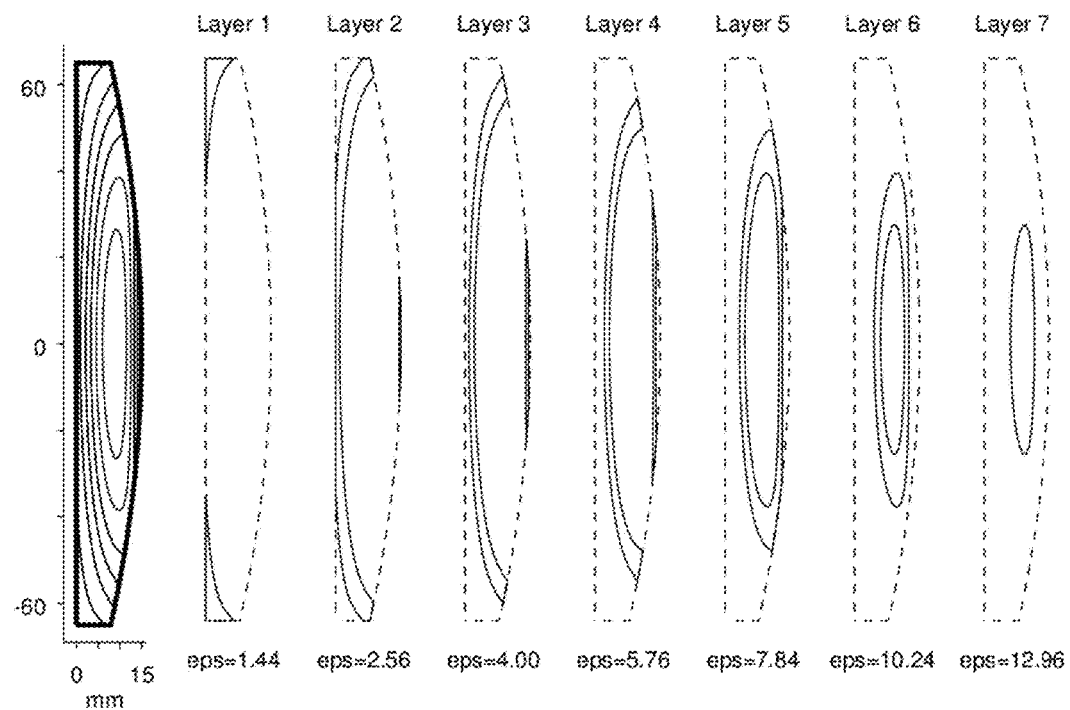
FIG. 8 shows discrete lens layers where the cuts between the layers of discrete media are defined by the locus of points sharing the same value (isolines) of refractive index or dielectric constant profile. The lines are chosen for uniform increments of, for example, 0.4 in refractive index to form an Embodiment A.
Figure 9:
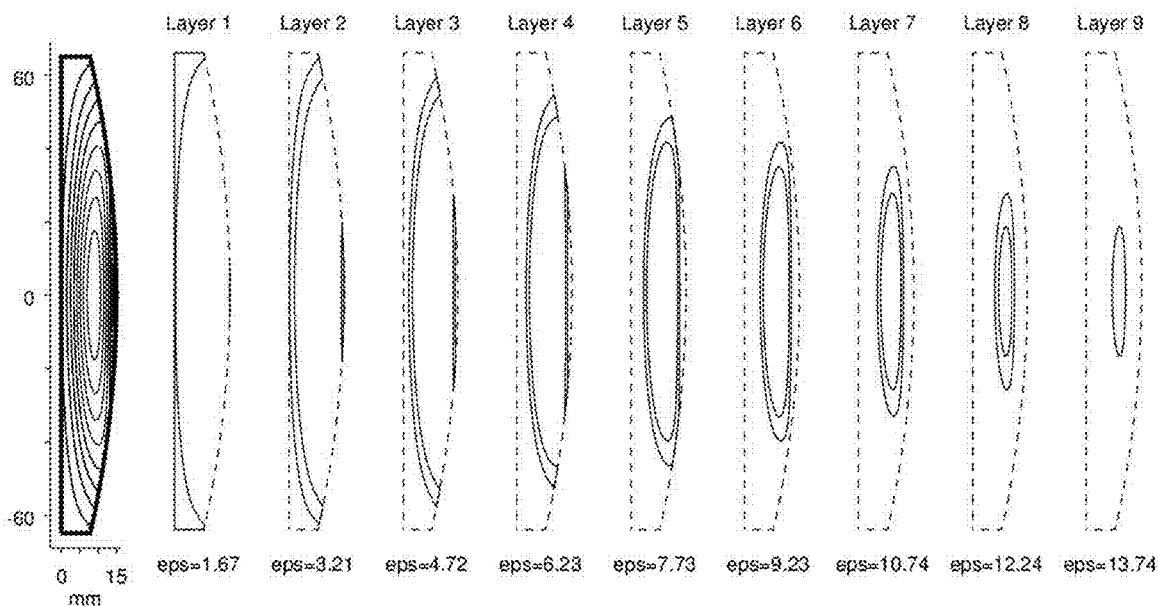
FIG. 9 shows discrete lens layers where the cuts between the layers of discrete media are defined by the locus of points sharing the same value (isolines) in the continuous dielectric constant profile. The lines are chosen for uniform increments of, for example, 1.5 in dielectric constant to form an Embodiment A.
Figures 10A, 10B, 10C:
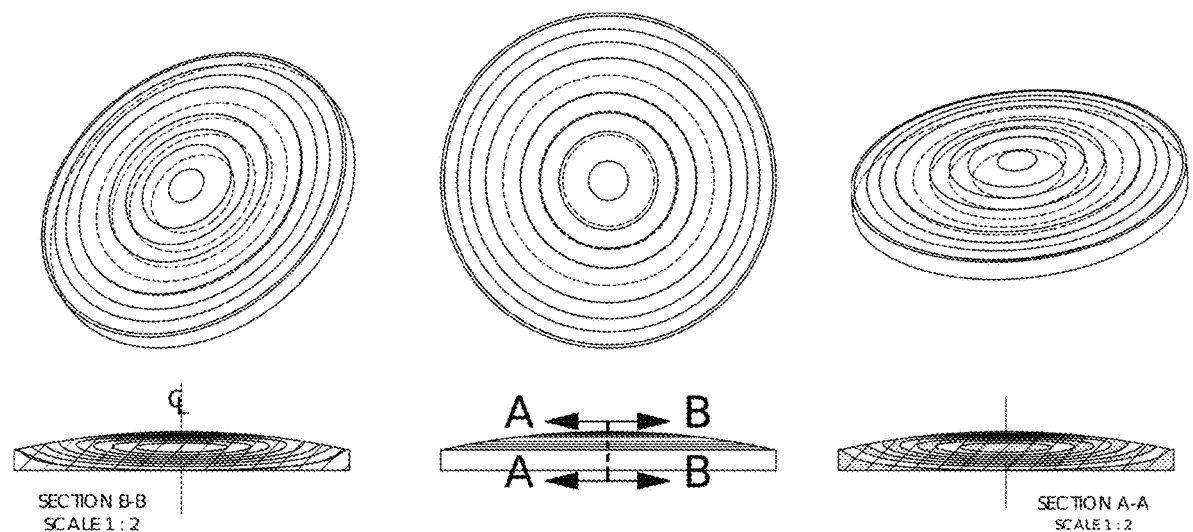
FIGS. 10(a), (b), (c) are perspective, top, and side views of circular implementation for equal-dielectric constant isolines with 1.5 separation for Embodiment A.

After repeatedly running the optimization loop, the individual designs from each optimization run are compared to determine which ones represent the best trade-off between on-axis aperture efficiency and off-axis aperture efficiency. The best result was selected as Embodiment A, which is illustrated in FIGS. 8, 9, and 10 and disclosed in more detail in co-pending application Ser. No. 15/722,561, filed Oct. 2, 2017, now U.S. Pat. No. 10,116,051, which is incorporated by reference herewith, and has a lens antenna comprised of an array lenses having a geometric center, a first configuration with a phase center offset from the geometric center and a second configuration with the phase center aligned with the geometric center. FIG. 8 and FIG. 9 show two different layering profiles, FIG. 8 produced by showing lavers separated by lines of uniform refractive index, and FIG. 9 produced by showing layers separated by lines of uniform dielectric constant. Embodiment A at Ku-band fits within a cylinder with D=13 cm diameter and T=1.5 cm height or "thickness". The back surface of the lens is flat, and the front surface is convex spherical with a radius of curvature of R=30 cm. The lens has an optical back focal length of 5 cm. The dielectric constant within the lens varies from 1.7 to 14.3 (refractive index of 1.3 to 3.8), depending on the exact discretization selected. The dielectric loss tangent within the lens should be as low as possible, preferably below 0.001 but should be lower than 0.005 throughout the 10-14 GHz band. This lens is designed to operate, i.e. have good beam properties for a field of regard defined by $\theta \in [0 \text{ deg}, 45 \text{ deg}]$ and $\varphi \in [0 \text{ deg}, 360 \text{ deg}]$.

This lens can be discretized and fabricated in several arrangements, but all implementations of the lens remain fundamentally the same. The lens can be produced with different external outlines, rather than the original circular outlines, while still using the same refractive index distribution. The other shapes can be viewed as a truncated or trimmed version of the circular lens, although they may potentially be manufactured directly as the desired shape in order to reduce costs. In order to ensure high manufacturability, it is designed as a continuous gradient, but discretized to use only homogeneous, low-loss materials to be constructed as a series of thin layers. The lens is designed to be used with a collection of feeds at different locations on the focal plane in order to generate beams at different pointing angles. Examples are provided in FIG. 7 of the square and hexagonal implementations of the lens, but the design is not limited to these aperture shapes. Non-planar tilings of lens elements may require the outline of the lenses to vary depending on the position of the lens within the tiling.

The continuous refractive index distribution with the 21 scalar coefficients determined by the optimization process is determined by the following polynomial within the lens. The r (radial vector) and z (axial vector) variables from FIG. 4 are evaluated from the back of the lens in millimeters. Different representations of the refractive index distribution, such as a different set of basic functions than powers of the cylindrical variables r and z or a different set of powers, or representation of the refractive index distribution as a numeric data table, do not change the identity of this lens. In addition, perturbations or changes to this profile or the coefficients used to represent the profile produce related designs in the same family as this lens, and so do not represent a fundamentally different lens design from that described here.

$$n(r, z) = 1.533383 - 1.478352 \cdot 10^{-4} r^2 +$$
$$2.873639 \cdot 10^{-8} r^4 - 4.907332 \cdot 10^{-18} r^6 + 2.763056 \cdot 10^{-1} z +$$
$$2.486028 \cdot 10^{-2} z^2 - 3.370549 \cdot 10^{-3} z^3 + 3.065626 \cdot 10^{-5} z^4 -$$
$$1.294440 \cdot 10^{-4} r^2 z + 1.239000 \cdot 10^{-5} r^2 z^2 - 6.454868 \cdot 10^{-7} r^2 z^3 +$$
$$3.639046 \cdot 10^{-8} r^2 z^4 + 9.551220 \cdot 10^{-9} r^4 z - 2.882505 \cdot 10^{-9} r^4 z^2 +$$
$$2.034582 \cdot 10^{-10} r^4 z^3 - 3.781935 \cdot 10^{-12} r^4 z^4 + 5.495423 \cdot 10^{-18} r^6 z -$$
$$1.384940 \cdot 10^{-18} r^6 z^2 + 7.639288 \cdot 10^{-20} r^6 z^3 + 1.865919 \cdot 10^{-21} r^6 z^4$$

The refractive index equation above is the square root of the permittivity distribution within the lens. Describing the refractive index distribution of the lens is equivalent to describing the permittivity or dielectric constant distribution.

Using the polynomial expression above, the lens can be divided into regions of uniform dielectric constant or refractive index based on isocontours of the refractive index distribution. In all cases, a set of lines are drawn across the surface of the lens, where the value of the refractive index or dielectric constant is identical at all points of the line. The area between adjacent lines is defined to have the mean refractive index of the two boundary lines, in these specific examples, but can be chosen differently (e.g. the mean index of the contours, the mean index of the region, the mean dielectric constant of the contours, the mean dielectric constant of the region) without changing the fundamental design or operation of the lens.

By assigning the layers within the lens such that the difference in refractive index between isolines is 0.4, then the lens can be constructed from seven discrete materials. In FIG. 8, Layer 1 is the outermost, lowest-index layer, and layer 7 is the innermost, highest-index layer. This discretization of the lens uses dielectric constants from 1.44 to 12.96. FIGS. 8, 9 show the sample designs created by FIG. 6.

Discretizing by dielectric constant rather than refractive index yields more uniform geometric steps between layers, and also samples the innermost, high-index regions with increased resolution. Finer sampling of the inner layers will yield better performance for fewer overall lens layers. By assigning the layers within the lens such that the difference in permittivity between adjacent layers is approximately 1.5, then the lens can be constructed from nine discrete materials, where each individual material is homogeneous. In FIG. 9, Layer 1 is the outermost, lowest-index layer, and layer 9 is the innermost, highest-index layer. This discretization of the lens uses dielectric constants (eps in the diagram below) from 1.67 to 13.74. The structure of the lens is illustrated in FIG. 10.

Figures 11A, 11B:
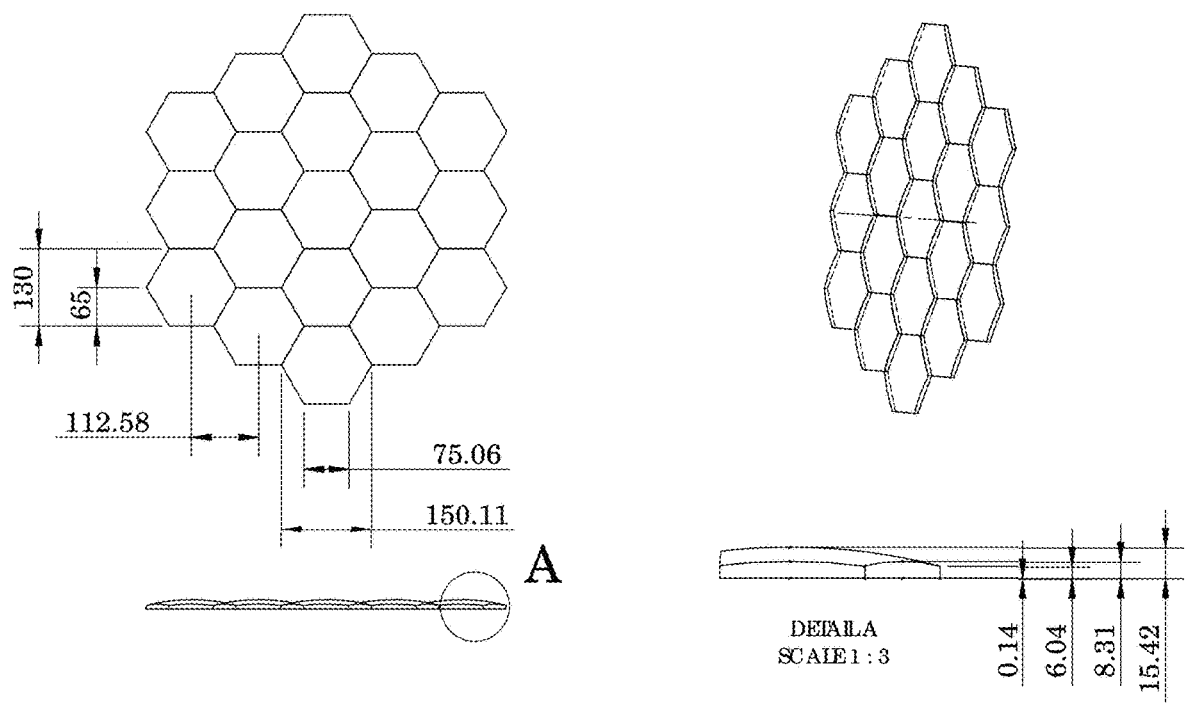
FIGS. 11(a), (b) are perspective, top, and side views of flat hexagonal array of hexagonal lens elements.
Figure 12A:
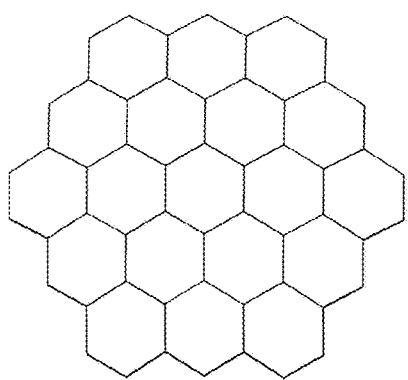
FIGS. 12(a), (b) are perspective, top, and side views of domed hexagonal array of hexagonal lens elements.
Figure 12A:
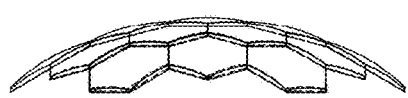
Figure 12B:
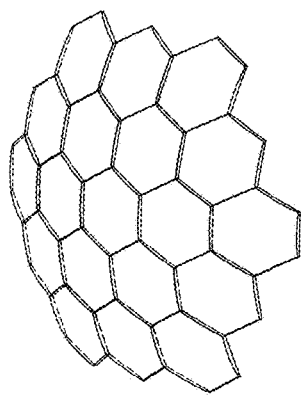
Figure 12B:
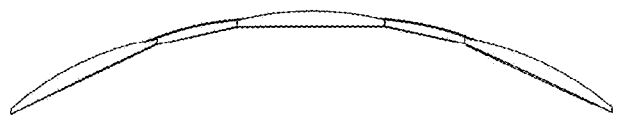

The geometric constraints of the design process followed to obtain this lens were set to be convenient for use in an array of lenses. The sides of the cylindrical lens are cut into a hexagonal shape to allow the lenses to be packed in a hexagonal array with flat-flat lens spacing of 13 cm, depicted in FIG. 11. Each of the lenses in the array has independent feeds placed behind the lens at the focal distance, from which a subset of feeds are selected to produce a directive element pattern, and then independently controlled and phased to allow for scanning the combined beam across the entire field of regard of the individual lenses using the standard principles of phased arrays. Each feed can either have capability and associated circuitry for receive-only, transmit-only, or transmit-receive functionality. Even for the case of a receive-only or transmit-only feed, adjacent feeds need not be the same, such that transmit-only and receive-only feeds could be interspersed to still cover the desired field of view. Either mechanism can allow simultaneous two-way communications. In addition, feeds can be wideband or multi-band to allow simultaneous operation of the antenna at multiple frequency bands, as long as the lens and anti-reflective coating are designed to operate over the same band(s).

The same lens can be combined in a non-planar array, such as that illustrated in FIG. 12, to yield a different scanning performance than that achievable in a flat array. A domed array represents a trade-off between the number of lenses that can target a beam in a particular direction and the field of regard of an individual lens. An appropriate dome size and number of sub-lenses can achieve wider scanning angles than is possible for a flat array of lenses.

Since the lenses are electrically large, the array factor of the resulting phased array will include grating lobes if the lenses are aligned in a periodic tiling. However, tiling the lenses aperiodically either in the plane of the planar array or as a combination of in-plane and out-of-plane motion in the case of the non-planar array ameliorates the grating lobes and sidelobes to acceptable levels.

As generally discussed with respect to FIGS. 5, 6, the system and method of the present invention include operation by one or more processing devices, including the processing device 201. It is noted that the processing device can be any suitable device, such as a computer, server, mainframe, processor, microprocessor, PC, tablet, smartphone, or the like. The processing device can be used in combination with other suitable components, such as a display device (monitor, LED screen, digital screen, etc.), memory or storage device 210, input device (touchscreen, keyboard, pointing device such as a mouse) 212, wireless module (for RF, Bluetooth, infrared, WiFi, etc.), and an output device 220 (screen, display, printer, etc.). The information may be stored on a computer hard drive, on a CD ROM disk or on any other appropriate data storage device, which can be located at or in communication with the processing device. The entire process is conducted automatically by the processing device, and without any manual interaction. Accordingly, unless indicated otherwise the process can occur substantially in real-time without any delays or manual action.

Each of the exemplary embodiments described above may be realized separately or in combination with other exemplary embodiments. The foregoing description and drawings should be considered as illustrative only of the principles of the invention. The invention may be configured in a variety of shapes and sizes and is not intended to be limited by the preferred embodiment. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

The invention claimed is:

1. A system, comprising:
one or more processors;
and memory including instructions that, when executed by the one or more processors, cause the system to:
receive one or more lens antenna design constraints, the one or more lens antenna design constraints requiring, at least in part, a plurality of laminar layers of discrete material types, wherein a refractive index of the plurality of laminar layers increases in non-uniform increments from an outermost layer of the plurality of laminar layers to an innermost layer of the plurality of laminar layers, and the one or more lens antenna design constraints that are received constrain a magnitude of a gradient of a refractive index profile, wherein the magnitude of the gradient indicates a rate of change of the refractive index;
generate a current candidate lens antenna based on the lens antenna design constraints and prior candidate lens antenna cost vectors, the current candidate lens antenna having a dielectric constant profile defined with a polynomial in an r-axis and a z-axis;
generate a plurality of rays for the current candidate lens antenna based on the one or more lens antenna design constraints;
compute a near-field distribution based on the rays generated for the current candidate lens antenna;
compute a far-field distribution based on the near-field distribution;
compute a current cost vector based on the far-field distribution and the near-field distribution for the current candidate lens antenna to maximize aperture efficiency;
determine if the current cost vector is compliant with the lens antenna design constraints;
provide the current cost vector as the prior candidate lens antenna cost vector to determine the current candidate lens antenna until the current cost vector is compliant with the lens antenna design constraints if the current cost vector is not compliant with the lens antenna design constraints;
and set the current candidate lens antenna as the selected lens antenna if the current cost vector is compliant with the lens antenna design constraints.

2. The system of claim 1, wherein the selected lens antenna has an inhomogeneous, isotropic dielectric.

3. The system of claim 1, wherein the instructions further include instructions that cause the system to:
select a geometry and the refractive gradient index profile for the selected lens antenna to meet the lens antenna design constraints.

4. The system of claim 1, wherein the system comprises a global, multi-objective optimization algorithm.

5. The system of claim 1, wherein the system comprises a local optimization algorithm.

6. The system of claim 1, wherein the instructions further include instructions that cause the system to:
maximize a performance for one or more excitations of feed elements simultaneously, the feed elements providing a signal through the lens antenna.

7. The system of claim 1, wherein the selected lens antenna is fabricated from homogeneous dielectric materials.

8. The system of claim 7, wherein the selected lens antenna has a gradient of the refractive index that comprises a collection of discrete layers of materials with distinct properties.

9. The system of claim 1, wherein the selected lens antenna comprises at least one feed element located a focal distance from a lens surface, where each feed element forms a beam at the output of the lens antenna at a spatial angle depending on a lateral displacement of a feed location from a nominal axis of symmetry.

10. The system of claim 9, wherein the at least one feed element simultaneously receive and transmit signals for two way, full-duplex communications.

11. The system of claim 1, wherein the selected lens antenna is controlled to operate in a receive-only mode.

12. The system of claim 11, wherein the selected lens antenna comprises one or more feed elements that are dual polarized, either linear at any orientation or circular, and the lens antenna does not introduce cross polarization.

13. The system of claim 12, further comprising a network of multiple feed elements that allow for multiple simultaneous beams in different spatial directions through the lens antenna.

14. The system of claim 13, where the lens antenna is a subcomponent of a base station wherein one or more of the beams are controlled to acquire, track, and communicate with either satellite or terrestrial nodes.

15. The system of claim 14, wherein the selected lens antenna is mounted on a satellite to form the one or more beams to illuminate at least a portion of earth from orbit.

16. The system of claim 1, wherein the selected lens antenna is used for terrestrial networks according to one of: cellular, point-to-point and point-to-multipoint wireless communications, satellite communications, direction-finding, radar, or signals intelligence.

17. The system of claim 1, wherein the instructions further include instructions that cause the system to:
compare, based on an on-axis aperture efficiency and an off-axis aperture efficiency, a plurality of the lens antenna design constraints.

18. The system of claim 1, wherein the selected lens antenna has electronic beam steering achieved by switching among separate feed elements or groups of feed elements or among ports of a multiple beam forming network comprising either a Butler matrix or a Rotman lens circuit, and wherein multiple discrete feed elements or ports are excited with a same signal, with magnitude offsets, phase offsets, or time delays, to improve radiation efficiency.

19. A system configured to design a lens antenna, comprising:
a processing device having an input device configured to receive one or more lens antenna design constraints, the one or more lens antenna design constraints requiring, at least in part, a plurality of laminar layers of discrete material types, wherein a refractive index of the plurality of laminar layers increases in non-uniform increments from an outermost layer of the plurality of laminar layers to an innermost layer of the plurality of laminar layers and the one or more lens antenna design constraints received by the processing device constrain a magnitude of a gradient of a refractive index profile, wherein the magnitude of the gradient indicates a rate of change of the refractive index;
the processing device configured to generate a current candidate lens antenna based on the lens antenna design constraints and prior candidate lens antenna cost vectors;
the processing device configured to generate a plurality of rays for the current candidate lens antenna based on the one or more lens antenna design constraints;

the processing device configured to compute a near-field distribution based on the plurality of rays generated for the current candidate lens antenna;

the processing device configured to compute a far-field distribution based on the near-field distribution;

the processing device computes a current cost vector based on the far-field distribution and the near-field distribution for the current candidate lens antenna to maximize aperture efficiency;

the processing device determines if the current cost vector is compliant with the one or more lens antenna design constraints;

wherein if the current cost vector is not compliant with the one or more lens antenna design constraints, the processing device provides the current cost vector as the prior candidate lens antenna cost vector to determine the current candidate lens antenna until the current cost vector is compliant with the one or more lens antenna design constraints;

and wherein if the current cost vector is complaint with the one or more lens antenna design constraints, the processing device sets the current candidate lens antenna as the selected lens antenna.

20. A computer-implemented method, comprising:

obtaining a plurality of lens antenna design constraints, the plurality of lens antenna design constraints requiring, at least in part, a plurality of laminar layers of discrete material types, wherein a refractive index of the plurality of laminar layers increases in non-uniform increments from an outermost layer of the plurality of laminar layers to an innermost layer of the plurality of laminar layers, and the plurality of lens antenna design constraints that are obtained constrain a magnitude of a gradient of a refractive index profile, wherein the magnitude of the gradient indicates a rate of change of the refractive index;

processing the set of lens antenna design constraints to generate a current candidate lens antenna based on the lens antenna design constraints and prior candidate lens antenna cost vectors;

generating a plurality of rays for the current candidate lens antenna based on the one or more lens antenna design constraints;

computing a near-field distribution based on the plurality of rays generated for the current candidate lens antenna;

computing a far-field distribution based on the near-field distribution;

computing a current cost vector based on the far-field distribution and the near-field distribution for the current candidate lens antenna to maximize aperture;

determining if the current cost vector is compliant with the one or more lens antenna design constraints;

using the current cost vector as the prior candidate lens antenna cost vector to determine the current candidate lens antenna until the current cost vector is compliant with the one or more lens antenna design constraints if the current cost vector is not compliant with the one or more lens antenna design constraints;

and setting the current candidate lens antenna as the selected lens antenna if the current cost vector is complaint with the one or more lens antenna design constraints.

* * * * *